United States Patent
Oshima et al.

(10) Patent No.: US 8,933,831 B2
(45) Date of Patent: Jan. 13, 2015

(54) ANALOG-TO-DIGITAL CONVERTER AND WIRELESS RECEIVER

(75) Inventors: Takashi Oshima, Moriya (JP); Yohei Nakamura, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 233 days.

(21) Appl. No.: 13/570,228

(22) Filed: Aug. 8, 2012

(65) Prior Publication Data
US 2013/0058437 A1 Mar. 7, 2013

(30) Foreign Application Priority Data

Sep. 6, 2011 (JP) ................................. 2011-193965

(51) Int. Cl.
*H03M 1/06* (2006.01)
*H03M 1/08* (2006.01)
*H03M 1/12* (2006.01)

(52) U.S. Cl.
CPC .............. *H03M 1/0836* (2013.01); *H03M 1/12* (2013.01); *H03M 1/1215* (2013.01)
USPC ............ 341/118; 341/155; 341/119; 341/120

(58) Field of Classification Search
CPC .... H03M 1/12; H03M 1/0836; H03M 1/1215
USPC .......................... 341/118, 119, 120, 155, 156
See application file for complete search history.

(56) References Cited

U.S. PATENT DOCUMENTS 6,621,431 B2 * 9/2003 Engl et al. ..................... 341/120
7,332,973 B2 * 2/2008 Lee et al. ........................ 331/25
7,365,607 B2 * 4/2008 Fahim ........................... 331/1 A
7,978,104 B2 * 7/2011 Johansson ..................... 341/120
8,004,446 B2 * 8/2011 Ozeki et al. ................... 341/161
2003/0080885 A1 5/2003 Tamba
(Continued)

FOREIGN PATENT DOCUMENTS

JP 2003-133954 A 5/2003
JP 2008-244576 A 10/2008
(Continued)

OTHER PUBLICATIONS

Takashi Oshima, et al. "Fast Nonlinear Deterministic Calibration of Pipelined A/D Converters," 2008 51st IEEE International Midwest Symposium on Circuits and Systems (MWSCAS2008), pp. 914-917, Aug. 2008.

Takashi Oshima et al., "Fast Digital Background Calibration for Pipelined A/D Converters", IEICE Technical Report, VLD2006-138, pp. 115-120, Mar. 2007.

(Continued)

*Primary Examiner* — Jean B Jeanglaude
(74) *Attorney, Agent, or Firm* — Miles & Stockbridge P.C.

(57) ABSTRACT

The influence of a jitter of a sampling clock of an analog-to-digital converter is digitally corrected at low power consumption. The sampling clock of the analog-to-digital converter is generated by a phase locked loop (PLL) using a reference clock, which has a lower frequency and lower jitter than the sampling clock, as a source oscillation. A time-to-digital converter (TDC) converts a timing error at a timing where the sampling clock and the reference clock are synchronized with each other into a digital value. A timing error at a sampling timing where the reference clock is not present is generated by interpolating a detected timing error. Thus, a jitter value of the sampling clock at each sampling timing is obtained. A sampling voltage error is calculated from the jitter value and the output of the analog-to-digital converter is digitally corrected.

15 Claims, 16 Drawing Sheets

(56) References Cited

U.S. PATENT DOCUMENTS

| | | | |
|---|---|---|---|
| 2007/0008204 A1* | 1/2007 | Rutten et al. | 341/155 |
| 2008/0238752 A1 | 10/2008 | Shimizu et al. | |
| 2009/0091482 A1 | 4/2009 | Oshima et al. | |

FOREIGN PATENT DOCUMENTS

| | | |
|---|---|---|
| JP | 2009-089320 A | 4/2009 |
| JP | 2009-117894 A | 5/2009 |
| JP | 2011-097215 A | 5/2011 |
| WO | WO 2011/039859 A1 | 4/2011 |

OTHER PUBLICATIONS

Takashi Oshima et al., "Novel sampling timing background calibration for time-interleaved A/D converters," 2009 52nd IEEE International Midwest Symposium on Circuits and Systems (MWSCAS2009), pp. 361-364, Aug. 2009.

Tomomi Takahashi et al., "Highly accurate on-chip background calibration for time-interleaved A/D converters", IEICE Transactions J93-A, pp. 613-625, Sep. 2010.

K. Nose et al., "A 1-ps resolution jitter-measurement macro using interpolated jitter oversampling," IEEE Journal of Solid-State Circuits, vol. 41, No. 12, pp. 2911-2920, Dec. 2006.

\* cited by examiner

ANALOG-TO-DIGITAL CONVERTER AND WIRELESS RECEIVER

CLAIM OF PRIORITY

The present application claims priority from Japanese patent application JP2011-193965 filed on Sep. 6, 2011, the content of which is hereby incorporated by reference into this application.

BACKGROUND OF THE INVENTION

1. Field of the Invention

The present invention relates to an analog-to-digital converter having a digital correcting function and a wireless receiver including the analog-to-digital converter.

2. Background Art

In the field of next-generation industrial altimeter measurement such as a semiconductor inspecting device and a semiconductor manufacturing device and in the field of next-generation wireless communication system such as software radio and cognitive radio, an analog-to-digital converter having a high effective resolution of 10 bits or more and an extremely high conversion rate of 1 GS/s or more is required.

To provide such an ultrafast and high-resolution analog-to-digital converter, various unfavorable characteristics of an analog circuit constituting the analog-to-digital converter need to be digitally corrected. Various techniques of correcting gain shortage of an amplifier in an analog circuit (Non-patent Documents 1 and 2) and various techniques of correcting the influence of skew that is a static time deviation of a sampling timing of an analog-to-digital converter (Non-patent Documents 3 and 4) are conventionally suggested.

However, it is difficult to correct the influence of a jitter that is a random time deviation of a sampling timing by performing adaptive control using a least mean square (LMS) algorithm because of its random properties. For example, to provide an effective resolution of 10 bits or more at a conversion rate of 1 GS/s, it is required that a jitter of a sampling clock is approximately 1 ps rms or less. Incidentally, rms is a square root of a square average value.

It is difficult to provide a low jitter clock at the high frequency of 1 GS/s and sufficiently low power consumption. In other words, under present circumstances, it is difficult to provide an ultrafast and high-resolution analog-to-digital converter because of the jitter included in the sampling clock.

Patent Document 1 discloses a technique of digitally correcting the influence of a jitter at an output side of an analog-to-digital converter to reduce the deterioration of the effective resolution of the analog-to-digital converter caused by the jitter of the sampling clock. FIG. 1 shows an analog-to-digital converter adapting such a technique. The structure of the analog-to-digital converter 10 will be briefly explained below.

The analog-to-digital converter 10 includes a phase locked loop (PLL) 11, a divider 12, an analog-to-digital conversion unit 13, a time-to-digital converter (TDC) 14, and a digital correction unit 15.

The analog-to-digital converter 10 frequency-divides by divider 12 the output of the phase locked loop (PLL) 11 using an output from a crystal oscillator and the like as a source oscillation, and supplies a frequency-divided clock signal to the analog-to-digital conversion unit 13 as a sampling clock (ADC CLK). The analog-to-digital conversion unit 13 samples an input analog voltage using the sampling clock and executes the analog-to-digital conversion of the sampled voltage to output the converted voltage. However, the output value of the analog-to-digital conversion unit 13 is influenced by the jitter of the sampling clock.

Accordingly, the analog-to-digital converter 10 inputs the sampling clock and the output of the PLL 11 to the time-to-digital converter 14. The time difference (jitter value) between the sampling clock and the output of the PLL at each voltage transition timing is given to the digital correction unit 15 for correcting the influence of the jitter.

The time-to-digital converter 14 is intensely studied and developed in recent years. For example, Non-patent Document 5 discloses a time-to-digital converter having a time resolution of approximately 1 ps. The time-to-digital converter 14 detects a jitter value included in a sampling clock with reference to an output of the phase locked loop 11 that is a negligible low jitter.

The digital correction unit 15 estimates a sampling voltage error at each sampling timing from the time difference (jitter value) detected by the time-to-digital converter 14, and corrects a raw digital output of the analog-to-digital conversion unit 13 based on the estimation result. Consequently, the analog-to-digital converter 10 disclosed in Patent Document 1 eliminates the influence of the jitter included in the sampling clock from the raw digital output of the analog-to-digital conversion unit 13.

[Patent Document 1] US2008/80238752
[Patent Document 2] JP Patent Publication (Kokai) No. 2009-117894
[Non-patent Document 1] Takashi Oshima, Tomomi Takahashi, Taizo Yamawaki, Cheonguyen Tsang, Dusan Stepanovic and Borivoje Nikolic, "Fast nonlinear deterministic calibration of pipelined A/D converters," 2008 51st IEEE International Midwest Symposium on Circuits and Systems (MWSCAS2008), pp. 914-917, August 2008.
[Non-patent Document 2] Takashi Oshima, Cheonguyen Tsang, Borivoje Nikolic, "Fast digital background calibration for pipelined A/D converters", IEICE Technical Report, VLD2006-138, pp. 115-120, March 2007
[Non-patent Document 3] Takashi Oshima, Tomomi Takahashi and Taizo Yamawaki, "Novel sampling timing background calibration for time-interleaved A/D converters," 2009 52nd IEEE International Midwest Symposium on Circuits and Systems (MWSCAS2009), pp. 361-364, August 2009.
[Non-patent Document 4] Tomomi Takahashi and Takashi Oshima, "Highly accurate on-chip background calibration for time-interleaved A/D converters", IEICE Transactions J93-A, pp. 613-625, September 2010.
[Non-patent Document 5] K. Nose, M. Kajita and M. Mizuno, "A 1-ps resolution jitter-measurement macro using interpolated jitter oversampling," IEEE Journal of Solid-State Circuits, vol. 41, No. 12, pp. 2911-2920, December 2006.

In the circuit structure disclosed in Patent Document 1, attention is focused on the fact that the output of the phase locked loop 11 has a higher frequency and shorter cycle than the sampling clock of the analog-to-digital conversion unit 13. In other words, this circuit structure makes use of the fact that the jitter included in the output of the phase locked loop 11 is smaller than that of the sampling clock.

To operate the phase locked loop 11 to have a higher frequency than the sampling clock, however, large power consumption is required. For example, in Patent Document 1, the output of the phase locked loop is 8 GHz while the sampling clock is 250 MHz. The output of the phase locked loop has a remarkably higher frequency. This means that the output of the phase locked loop is 32 GHz, which is a high frequency, when the sampling clock is 1 GHz. The large power consumption and difficult high frequency circuit implementation are required. Thus, it is difficult to use the analog-to-digital converter disclosed in Patent Document 1 as an ultrafast and high-resolution analog-to-digital converter required for next-generation industrial altimeter measurement and wireless communication system.

As described above, the practical use of an analog-to-digital converter capable of digitally correcting the influence of a jitter included in a sampling clock at lower power consumption is desired.

SUMMARY OF THE INVENTION

The inventors provide an analog-to-digital converter including the following parts:
(1) a phase locked loop that uses a reference clock as a source oscillation, has a higher frequency than the reference clock, and generates a sampling clock synchronizing with the reference clock;
(2) an analog-to-digital conversion unit that samples an input analog voltage using the sampling clock and converts the input analog voltage into a digital value
(3) a time-to-digital converter that detects a time difference between a voltage transition timing of the reference clock and a voltage transition timing of the sampling clock and converts the time difference into a differential digital value; and
(4) a digital correction unit that interpolates the differential digital value to obtain an interpolation value corresponding to each sampling timing and digitally corrects influence of a jitter of the sampling clock included in a raw digital output of the analog-to-digital conversion unit by the interpolation value.

According to the present invention, the influence of a jitter of a sampling clock used in an analog-to-digital converter can be digitally corrected at low power consumption. Consequently, an analog-to-digital converter that is ultrafast of 1 GS/s or more and has a high resolution of 10 bits or more can be provided.

Problems, structures, and advantageous effects other than those mentioned above will be explained with reference to embodiments.

DETAILED DESCRIPTION OF THE PREFERRED EMBODIMENTS

Figure 1:
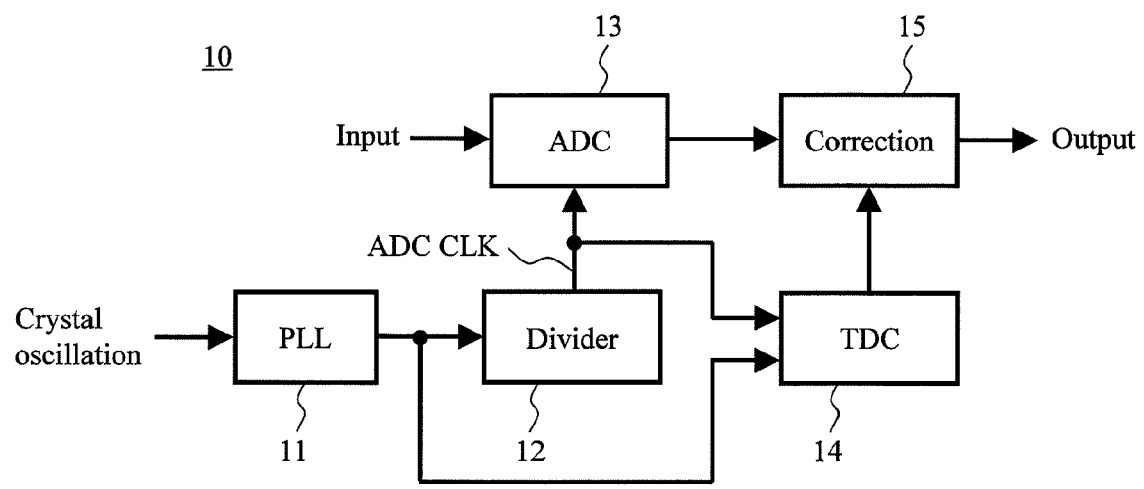
FIG. 1 is an illustration for explaining a conventional example of an analog-to-digital converter having a jitter correcting function.

In the embodiments described below, the invention will be described in a plurality of sections or embodiments when required as a matter of convenience. The sections or embodiments are not irrelevant to each other unless otherwise stated, and the one relates to the entire or a part of the other as a modification example, applications, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number may be larger or smaller than the specific number.

Furthermore, in the embodiment described below, components (including element steps) are not always indispensable unless otherwise stated or except the case where the components are apparently indispensable in principle. Similarly, in the embodiments described below, when the shape of the components, positional relationship thereof, and the like are mentioned, the substantially approximate and similar shapes and the like are included therein unless otherwise stated or except the case where it is conceivable that they are apparently excluded in principle. The same goes for the numerical value (including the number of pieces, values, amount, range, and the like) described above.

The embodiments of the present invention will be explained in detail below with reference to the accompanying drawings. The components having the same function are denoted by the same or related reference numerals throughout the drawings for explaining the embodiments, and the repetitive explanation thereof is omitted. In the embodiment described below, the description of the same or similar portions is not repeated in principle unless particularly required.

First Embodiment

Figure 2:
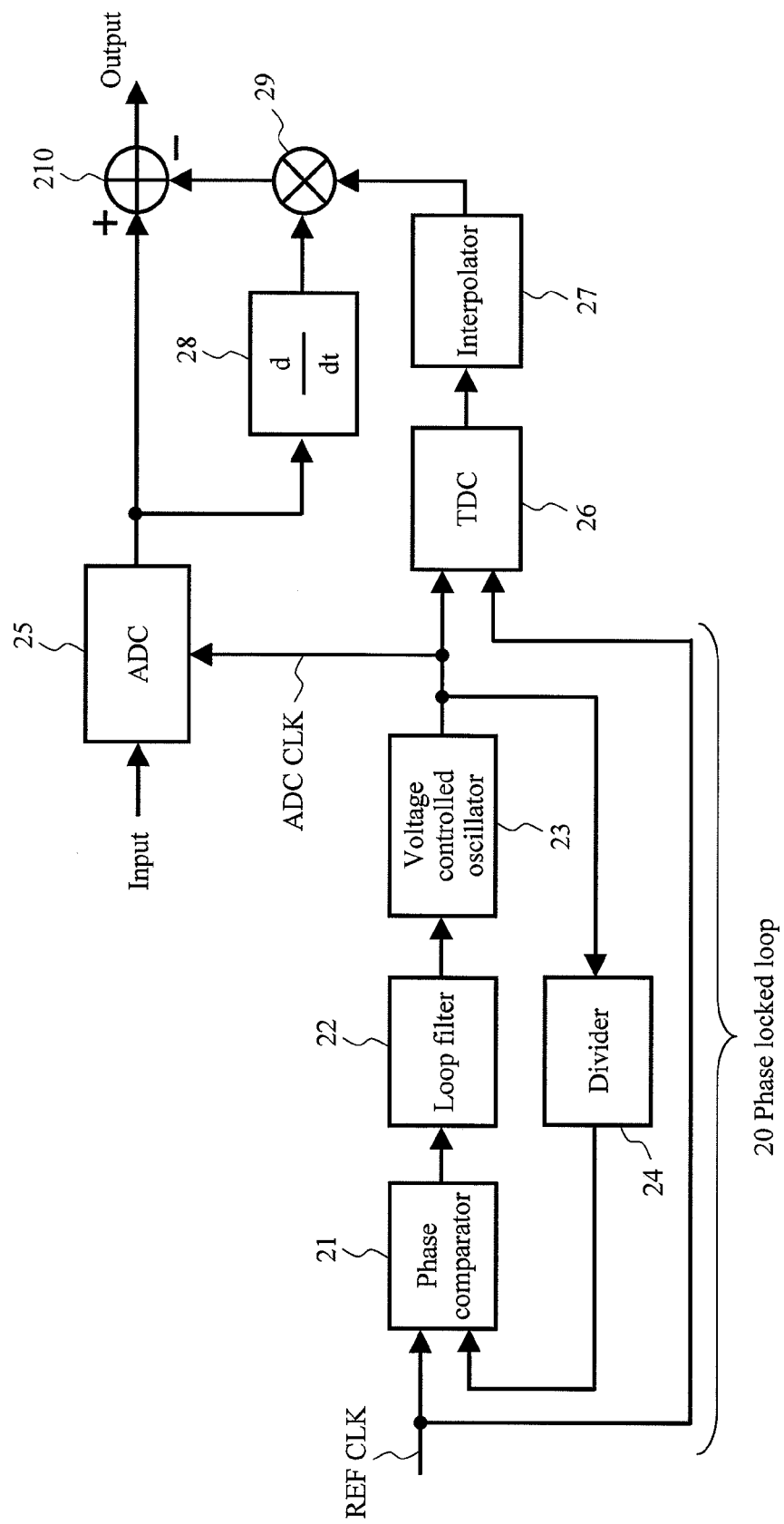
FIG. 2 shows a structure of an analog-to-digital converter having a jitter correcting function according to a first embodiment.

FIG. 2 shows an example of a structure of an analog-to-digital converter according to a first embodiment. In the first embodiment, a sampling clock (ADC CLK) used in the analog-to-digital converter is generated in a phase locked loop (PLL) 20 using a reference clock (REF CLK) as a source oscillation.

The phase locked loop 20 includes a phase comparator 21, a loop filter 22, a voltage control oscillator (VCO) 23, a divider 24, and the like. Incidentally, the phase comparator 21 may be a phase frequency comparator, and a charge pump circuit may be provided between the phase comparator 21 and the loop filter 22. Generally, a low-pass filter is used as the loop filter 22.

The circuit structure of the phase locked loop 20 is commonly known. Accordingly, the phase locked loop 20 performs the normal operation that is commonly known. Specifically, the output of the voltage control oscillator 23 is synchronized with the phase of the reference clock. The output of the voltage control oscillator 23 includes a sine wave of a frequency that is several times as large as the number of frequency division of the reference clock in the divider 24, and a clock signal. The output of the voltage control oscillator 23 is used as a sampling clock (ADC CLK). The reference clock according to this embodiment has a lower frequency than the sampling clock (ADC CLK).

The analog-to-digital converter includes an analog-to-digital conversion unit (ADC) 25, a time-to-digital converter (TDC) 26, an interpolator 27, and a digital correction unit.

The digital correction unit is connected to an output side of the analog-to-digital conversion unit 25. The digital correction unit digitally corrects a raw digital output of the analog-to-digital conversion unit 25 by subtracting a sampling error voltage caused by the jitter of the sampling clock from the raw digital output of the analog-to-digital conversion unit 25. Hereinafter, the output immediately after being outputted from the analog-to-digital conversion unit 25, i.e., the output that is not digitally corrected at all, is referred to as a "raw digital output" to be distinguished from an output that is digitally corrected.

The digital correction unit includes a differentiator 28 connected to the output of the analog-to-digital conversion unit 25, a multiplier 29 that multiplies the output by an estimated value of the jitter, a subtractor 210 that subtracts the multiplication result of the multiplier 29 from the output of the analog-to-digital conversion unit 25 and the like.

The analog-to-digital conversion unit 25 samples an input analog voltage at a voltage transition timing (for example, a rising timing from a low voltage to a high voltage) of the sampling clock (ADC CLK), and executes the analog-to-digital conversion of the sampled voltage.

For example, when the voltage transition timing of the sampling clock (ADC CLK) is shifted by $\Delta t$ from an ideal sampling timing nT (T indicates one conversion cycle and an inverse of the frequency of the sampling clock, and n indicates a sampling number), the sampled voltage is indicated by $V(nT+\Delta t)$. $\Delta t$ corresponds to a jitter value.

The sampled voltage is represented by the primary approximate expression using $\Delta t$ as follows.

$$V(nT+\Delta t) = V(nT) + \Delta t * dV/dt(nT)$$

In the raw digital output of the analog-to-digital conversion unit 25, the sampling voltage error represented by $\Delta t * dV/dt(nT)$ is included in the voltage $V(nT)$ sampled at the ideal timing.

Here, $dV/dt(nT)$ is obtained by the differentiator 28. A multiplication value of $\Delta t$ and $dV/dt(nT)$ is calculated by the multiplier 29. The multiplication value supplies an estimated value of the sampling error voltage, i.e., $\Delta t * dV/dt(nT)$. The subtractor 210 subtracts the calculated $\Delta t * dV/dt(nT)$ from the raw digital output, and digitally corrects the influence of the sampling error voltage.

Next, how to obtain a jitter value (i.e., $\Delta t$) randomly overlapped with the sampling clock (ADC CLK) will be explained. Firstly, the sampling clock (ADC CLK) and the reference clock (REF CLK) are inputted to the time-to-digital converter (TDC) 26. As described above, the frequency of the reference clock (REF CLK) is one-(frequency division number)th of the frequency of the sampling clock (ADC CLK).

The time-to-digital converter 26 detects a time difference between each voltage transition timing of the reference clock (REF CLK) and the voltage transition timing of the sampling clock (ADC CLK) corresponding to the voltage transition timing, and converts it to a digital value.

The sampling clock (ADC CLK) is applied to both of the analog-to-digital conversion unit 25 and the time-to-digital converter 26. Thus, the digital output of the time-to-digital converter 26 is regarded as a timing deviation of voltage transition of the sampling clock (ADC CLK) at each voltage transition timing of the reference clock (REF CLK), i.e., a digital value of the jitter value.

The interpolator 27 is connected to an output side of the time-to-digital converter 26. The interpolator 27 interpolates the digital value inputted from the time-to-digital converter 26, and obtains estimated values of the jitter at all timings of the sampling clock (ADC CLK). The jitter estimated value $\Delta t$ is given to the digital correction unit to be used for digitally correcting the sampling error voltage as described above.

Incidentally, a certain time difference, i.e., skew, may be originally provided between the sampling clock (AD CLK) inputted to the time-to-digital converter 26 and the reference clock (REF CLK) due to a delay time difference caused by wiring delay. However, even when the skew is present, the skew appears as a direct current component in the output of the time-to-digital converter 26. Thus, to obtain only the jitter value, it is required that the direct current component corresponding to the skew is removed from the output of the time-to-digital converter 26.

In this embodiment, the reference clock (REF CLK) is a sufficiently low jitter. In practice, the reference clock (REF CLK) that is the sufficiently low jitter can be obtained using an oscillation output from a general quartz oscillator, ceramic oscillator, SAW oscillator, or the like.

Figure 3:
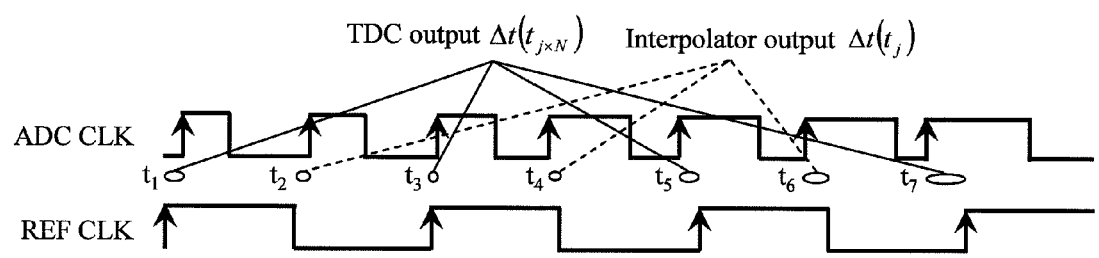
FIG. 3 is an illustration for explaining the operation of the analog-to-digital converter having the jitter correcting function according to the first embodiment.

FIG. 3 shows a waveform relationship of the sampling clock (ADC CLK) of the analog-to-digital conversion unit 25 and the reference clock (REF CLK) when the frequency of the sampling clock is twice as that of the reference clock. In other words, the waveforms shown in FIG. 3 are provided when the frequency division number of the divider 24 is 2 in the phase locked loop 20.

For example, when the sampling clock (ADC CLK) is 1 GHz and the reference clock (REF CLK) is 50 MHz, the frequencies of both clocks differ from each other by 20 times. For facilitating explanation in general, however, FIG. 3 shows the case when the frequencies of the clocks differ from each other by twice.

As shown in FIG. 3, the rising timings of the reference clock (REF CLK) (indicated by up arrows) are synchronized with the odd-numbered timings of the sampling clock (ADC CLK) (i.e., t1, t3, t5, t7, . . . ).

Thus, the jitter value of the sampling clock (ADC CLK) at the odd-numbered sampling timing can be directly obtained from the digital output value of the time-to-digital converter (TDC) 26 as described above. The interpolator 27 outputs the digital output value to the multiplier 29.

On the other hand, the rising timings of the reference clock (REF CLK) are not present at the even-numbered sampling timings (i.e., t2, t4, t6, . . . ). It is because the sampling clock (ADC CLK) is twice as fast as the reference clock (REF CLK) as described above. Accordingly, at the even-numbered sampling timing, the jitter value of the sampling clock (ADC CLK) cannot be detected by the time-to-digital converter (TDC) 26.

Thus, the interpolator 27 estimates a jitter value at the even-numbered sampling timing from one or more digital output values obtained at the odd-numbered sampling timings, and outputs the estimated value to the multiplier 29.

Figure 4:
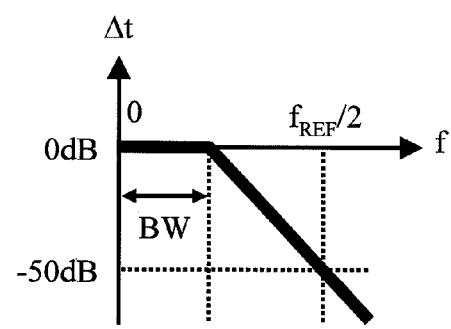
FIG. 4 is an illustration for explaining a frequency spectrum as viewing a jitter as a time-varying signal.
Figure 5:
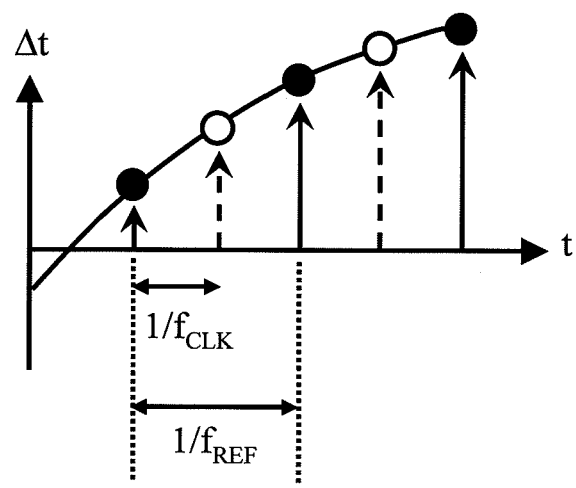
FIG. 5 is an illustration for explaining a time waveform as viewing a jitter as a time-varying signal.

How the interpolator 27 estimates the jitter value at the even-numbered sampling timing will be explained below with reference to FIGS. 4 and 5. FIGS. 4 and 5 show a frequency spectrum and time waveform, respectively, as viewing the jitter of the sampling clock (ADC CLK) as a time-varying signal.

As described above, the sampling clock (ADC CLK) is the output of the phase locked loop (PLL) 20. Accordingly, the jitter is mainly composed of a low frequency component. In general, in the output of the phase locked loop 20, the noise of the voltage control oscillator (VCO) 23 that is a component thereof is provided as the jitter. The noise voltage of the voltage control oscillator (VCO) 23 is inversely proportional to the frequency, and serves as the jitter when the oscillation is outputted. Accordingly, the jitter is mainly composed of the low frequency component.

The jitter caused by the voltage control oscillator 23 is high-pass filtered at a frequency in the loop band or less of the phase locked loop 20. Thus, the jitter having a frequency in the loop band or less is at a substantially constant level.

Moreover, the noise from another circuit block constituting the phase locked loop 20 is suppressed by a low-pass filter having a cut-off frequency substantially in the loop band (BW) of the phase locked loop 20, and is provided as a jitter in the output of the phase locked loop 20. Accordingly, the jitter caused by the circuit other than the voltage control oscillator 23 is mainly composed of a low frequency component.

On the other hand, for example, in FIG. 4, when the loop band (BW) of the phase locked loop 20 is 80 kHz and the reference clock (REF CLK) is 50 MHz, the jitter around 25 MHz (=50 MHz/2) that is a Nyquist frequency of the reference clock (REF CLK) is approximately 50 dB (=20*log 10(25 MHz/80 kHz)). The high frequency component of the jitter is suppressed in the output of the phase locked loop 20 as compared to the low frequency component of the jitter. In other words, the jitter signal is mainly composed of a frequency component that is less than the Nyquist frequency of the reference clock (REF CLK).

The digital output of the time-to-digital converter (TDC) 26 is equivalent to a value obtained by sampling the jitter signal in the sampling clock (ADC CLK) with the frequency of the reference clock (REF CLK). Thus, when the signal band of the jitter is the Nyquist frequency or less, the jitter signal value can be reproduced at any time by performing predetermined calculation for each output sample of the time-to-digital converter (TDC) 26 using sampling theorem.

As shown in FIG. 5, the interpolator 27 estimates a jitter value at a sampling timing (indicated by a white circle), where the output of the time-to-digital converter (TDC) 26 is not obtained because the rising timing of the reference clock (REF CLK) does not exist, by performing calculation using sampling theorem or the like for an output (indicated by a black circle) of the time-to-digital converter (TDC) 26. FIGS. 4 and 5 show the case where the frequency of the sampling clock (ADC CLK) is twice as that of the reference clock (REF CLK) as well as FIG. 3.

Incidentally, the interpolator 27 can adopt methods other than a strict interpolating method such as sampling theorem. For example, a simple interpolating method such as a linear interpolation method or a method of holding a value equivalent to a sampling value (zero-order hold) may be used. The interpolating method adopted by the interpolator 27 can be appropriately decided depending on an allowable implementation scale.

Figure 6:
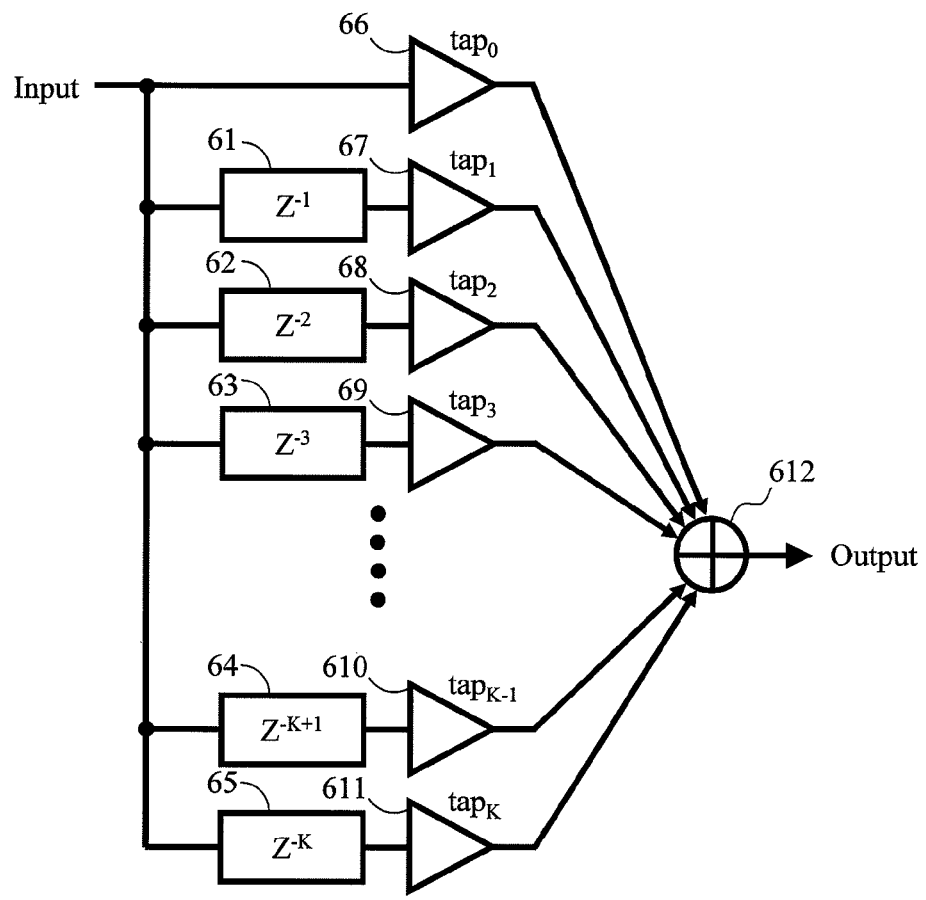
FIG. 6 is an illustration for explaining exemplary implementation of a differentiator.

FIG. 6 shows exemplary implementation of the differentiator 28 used in this embodiment. As shown in Non-patent Documents 3 and 4, when a frequency band of a discrete time signal (a signal sampled at a certain time interval T) is a Nyquist frequency (½T) or less, a differential value of the discrete time signal can be obtained by a finite impulse response (FIR) digital filter having a predetermined fixed tap coefficient.

In the example shown in FIG. 6, the differentiator 28 is provided as a FIR filter of (K+1) tap (wherein K is an even number). Fixed values disclosed in Non-patent Documents 3 and 4 can be used for tap coefficients $tap_0$ to $tap_K$.

An input signal (a raw digital output of the analog-to-digital conversion unit 25) is delayed by 1, 2, 3, . . . , K−1, K sample using delay devices 61 to 65, and then is multiplied by $tap_0$ to $tap_K$ using constant multipliers 66 to 611 corresponding to delay outputs. Then, the output of each of the constant multipliers 66 to 611 is added in an adder 612 and is outputted as a differential output.

Incidentally, in the differentiator 28 as described above, the differential output is delayed by K/2 sample from the input. Thus, the delay devices are appropriately inserted in calculation of the digital correction unit, and the calculation is executed at a timing upon considering the time delay.

Figure 7:
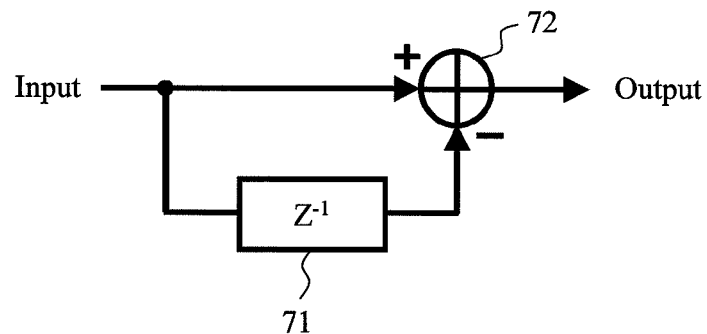
FIG. 7 is an illustration for explaining another exemplary implementation of the differentiator.

FIG. 7 shows an example of a structure of a simple differentiator 28. Specifically, it shows the structure when a differentiating device is adopted. The differentiator 28 shown in FIG. 7 outputs a difference between a current sample signal and a signal delayed by one sample from the delay device 71 that is obtained by an adder 72. When the frequency band of the analog input signal inputted to the analog-to-digital conversion unit 25 is sufficiently small, the differentiator 28 composed of the adder 72 as shown in FIG. 7 may be substituted.

(Summary)

As described above, in this embodiment, the sampling clock (ADC CLK) is generated in the phase locked loop 20 using the lower reference clock (REF CLK) as a source oscillation. Thus, even when the sampling clock (ADC CLK) becomes ultrafast, the analog-to-digital converter capable of digitally correcting the influence of the jitter at low power consumption can be provided. In other words, the analog-to-digital converter that is ultrafast of 1 GS/s or more and has a high resolution of 10 bits or more can be provided.

Second Embodiment

Figure 8:
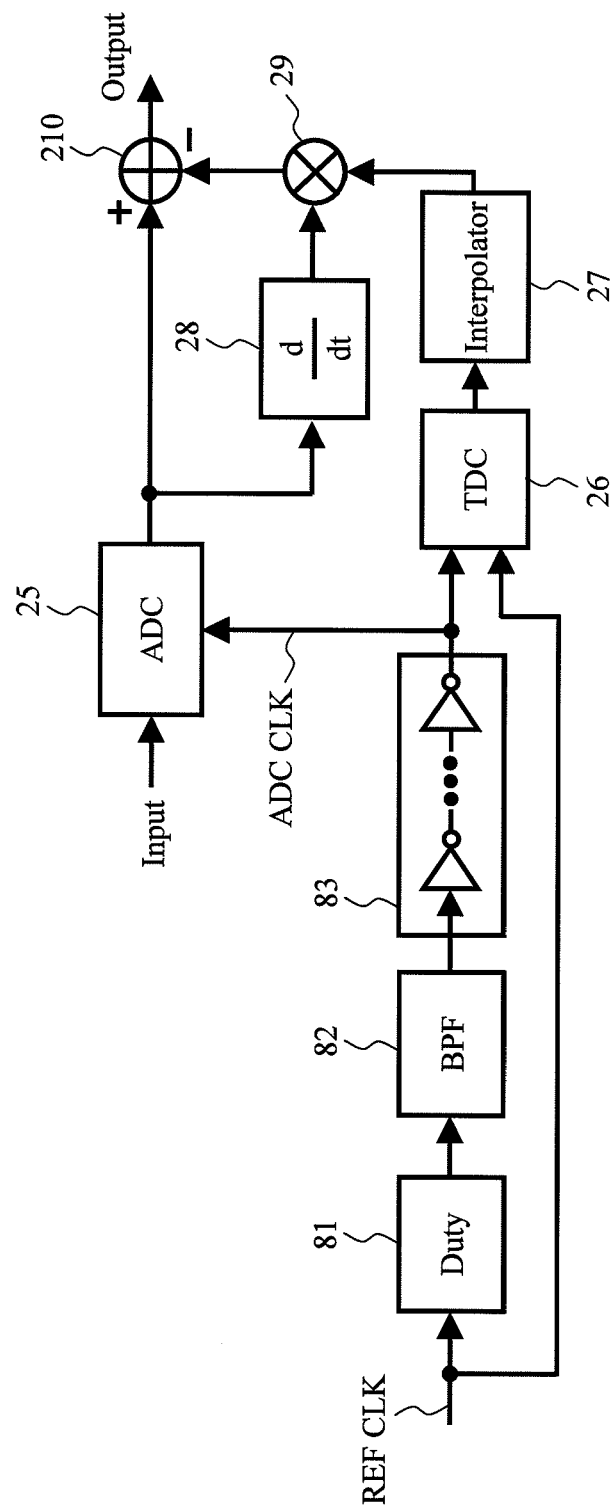
FIG. 8 shows a structure of an analog-to-digital converter having a jitter correcting function according to a second embodiment.

FIG. 8 shows an example of a structure of an analog-to-digital converter according to a second embodiment. The analog-to-digital converter, which has the same circuit structure as in the first embodiment except that the phase locked loop 20 according to the first embodiment is replaced by a circuit structure described later, will be explained in this embodiment. Specifically, the case where the phase locked loop 20 is replaced by a circuit composed of a duty adjustment unit (Duty) 81, a band pass filter (BPF) 82 connected to the output thereof, and a buffer 83 connected to the output thereof will be explained. The structures and operations of the analog-to-digital conversion unit (ADC) 25, the digital correction unit, the time-to-digital converter 26, and the interpolator 27 are the same as in the first embodiment.

Figure 9:
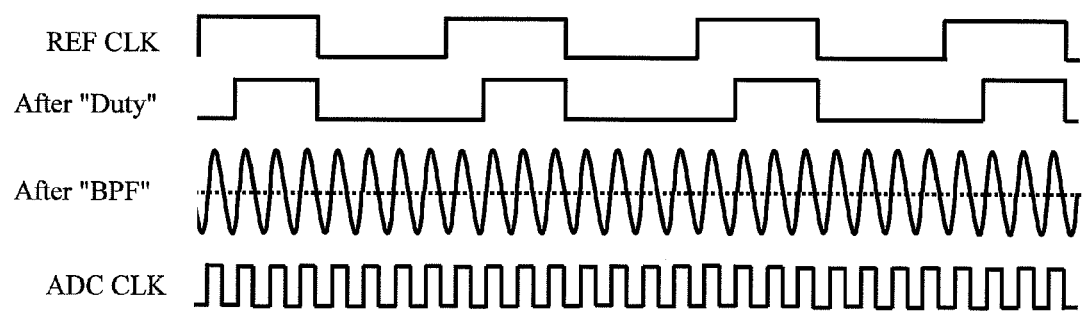
FIG. 9 is an illustration for explaining the operation of the analog-to-digital converter having the jitter correcting function according to the second embodiment.

FIG. 9 shows waveforms of outputs from the duty adjustment unit 81, the band pass filter 82, and the buffer 83. FIG. 9 shows the case where the frequency of the sampling clock (ADC CLK) of the analog-to-digital conversion unit 25 is eight times higher than the frequency of the reference clock (REF CLK).

When the duty of the reference clock (REF CLK) is ½, a harmonic component that is an even multiple of the frequency of the reference clock (REF CLK) is not included. However, when the duty of the output clock is reduced to approximately ⅓ in the duty adjustment unit 81, a predetermined amount of a harmonic component that is eight times higher than the frequency of the reference clock (REF CLK) can be included in the output clock. The duty adjustment unit 81 can be easily provided by an inverter delay device, an AND gate, or the like.

The band pass filter 82 has steep characteristics to have a high Q value. Thus, in this embodiment, only high harmonic component that is eight times higher than the frequency of the reference clock (REF CLK) included in the output clock of the duty adjustment unit 81 is passed.

The buffer 83 is composed of, for example, a cascade connected inverter, and amplifies the harmonic component that is eight times higher as the output of the band pass filter 82 to a logic level (low level, high level). Accordingly, a rectangular pulse appears at the output stage of the buffer 83, and is outputted as the sampling clock (ADC CLK) of the analog-to-digital conversion unit 25.

Incidentally, the frequency of the sampling clock (ADC CLK) is strictly synchronized with the frequency of the reference clock (REF CLK) to be eight times higher. Therefore, the jitter can be detected using the time-to-digital converter (TDC) 26 as in the first embodiment.

Thus, in the second embodiment, the analog-to-digital converter capable of digitally correcting the influence of the jitter at low power consumption even when the sampling clock (ADC CLK) becomes ultrafast can be provided like the first embodiment.

Third Embodiment

Figure 10:
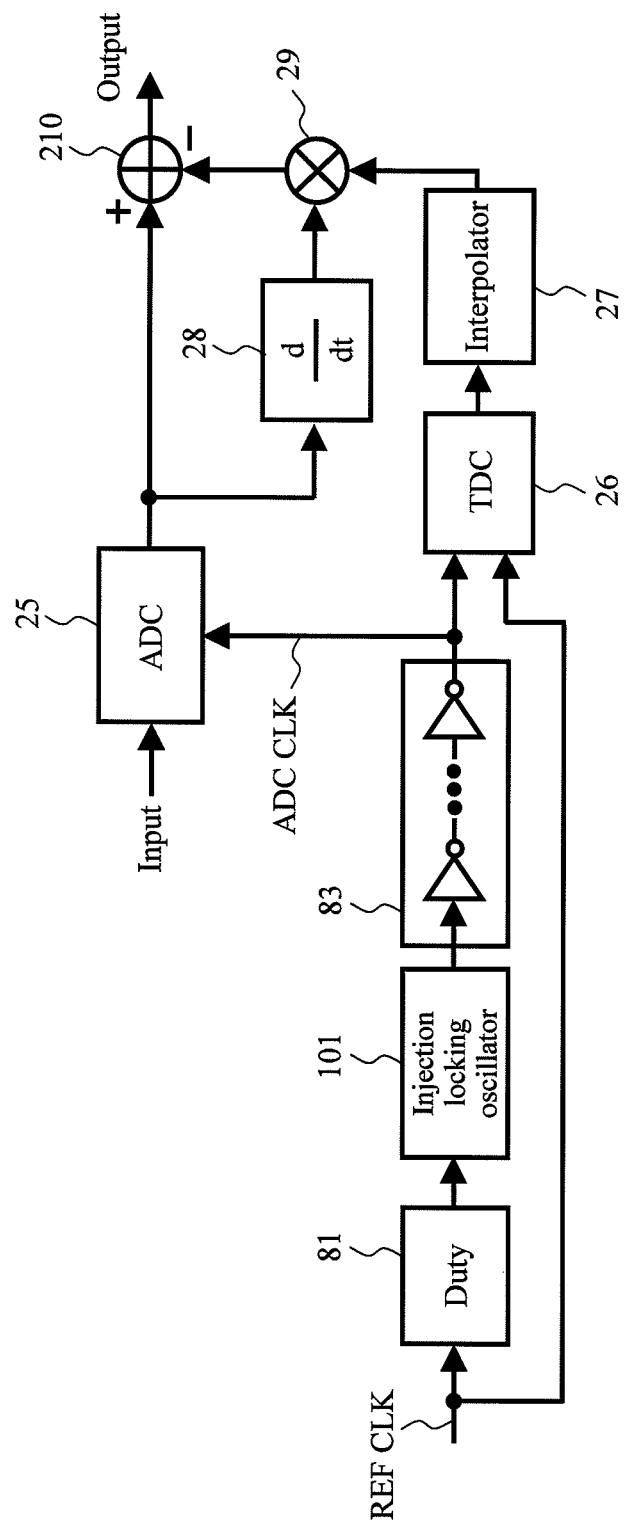
FIG. 10 shows a structure of an analog-to-digital converter having a jitter correcting function according to a third embodiment.

FIG. 10 shows an example of a structure of an analog-to-digital converter according to a third embodiment. The analog-to-digital converter, which has the circuit structure as in the first embodiment except that the phase locked loop 20 according to the first embodiment is replaced by a circuit structure described later, will be explained in this embodiment. Specifically, the case where the phase locked loop 20 is replaced by a circuit composed of a duty adjustment unit (Duty) 81, an injection locking oscillator 101 connected to the output thereof, and a buffer 83 connected to the output thereof will be explained. Thus, the structures and operations of the analog-to-digital conversion unit (ADC) 25, the digital correction unit, the time-to-digital converter 26, and the interpolator 27 are the same as in the first embodiment.

Figure 11:
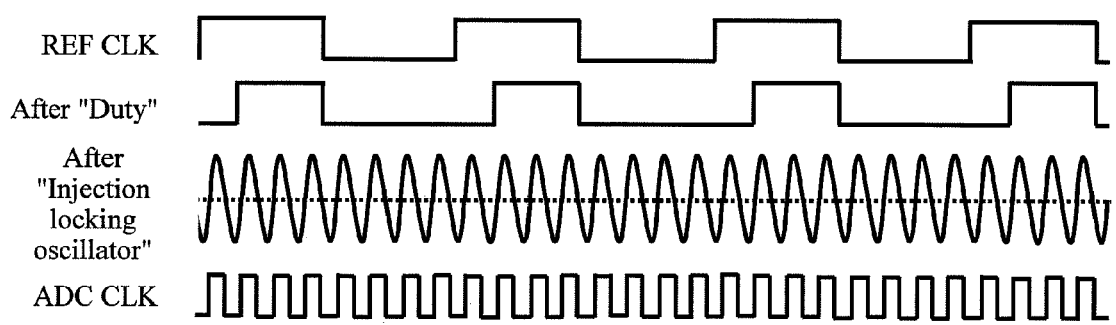
FIG. 11 is an illustration for explaining the operation of the analog-to-digital converter having the jitter correcting function according to the third embodiment.

FIG. 11 shows waveforms of outputs from the duty adjustment unit 81, the injection locking oscillator 101, and the buffer 83. FIG. 11 shows the case where the frequency of the sampling clock (ADC CLK) of the analog-to-digital conversion unit 25 is eight times higher than the frequency of the reference clock (REF CLK).

The duty adjustment unit 81 according to this embodiment reduces the duty of the reference clock (REF CLK) to approximately ⅓, and generates a predetermined amount of a harmonic component in the output clock like the second embodiment. The harmonic component is eight times higher than the frequency of the reference clock (REF CLK).

For example, as explained in Patent Document 2, the injection locking oscillator 101 injects an outside clock to an inside node in a normal oscillation circuit and forcibly locks the oscillation frequency to a frequency that is an integral multiple of the injected clock.

The locked oscillation frequency is decided depending on the time constant of the oscillation circuit. In this embodiment, the clock outputted from the duty adjustment unit 81 is injected to the injection locking oscillator 101. The time constant in the oscillation circuit of the injection locking oscillator 101 is set to be approximately eight times higher than the frequency of the reference clock (REF CLK). Accordingly, the oscillation frequency of the injection locking oscillator 101 is locked to be eight times higher than the frequency of the reference clock (REF CLK).

The buffer 83 is composed of, for example, a cascade connected inverter as in the second embodiment, and amplifies the harmonic component that is eight times higher as the output of the band pass filter 82 to a logic level (low level, high level). Accordingly, a rectangular pulse appears at the output stage of the buffer 83, and is outputted as a sampling clock (ADC CLK) of the analog-to-digital conversion unit 25.

Incidentally, the frequency of the sampling clock (ADC CLK) is strictly synchronized with the frequency of the reference clock (REF CLK) to be eight times higher. Thus, the jitter can be detected using the time-to-digital converter (TDC) 26 as in the first embodiment.

Thus, in the third embodiment, the analog-to-digital converter capable of digitally correcting the influence of the jitter at low power consumption even when the sampling clock (ADC CLK) becomes ultrafast can be provided like the first and second embodiments.

Fourth Embodiment

Figure 12:
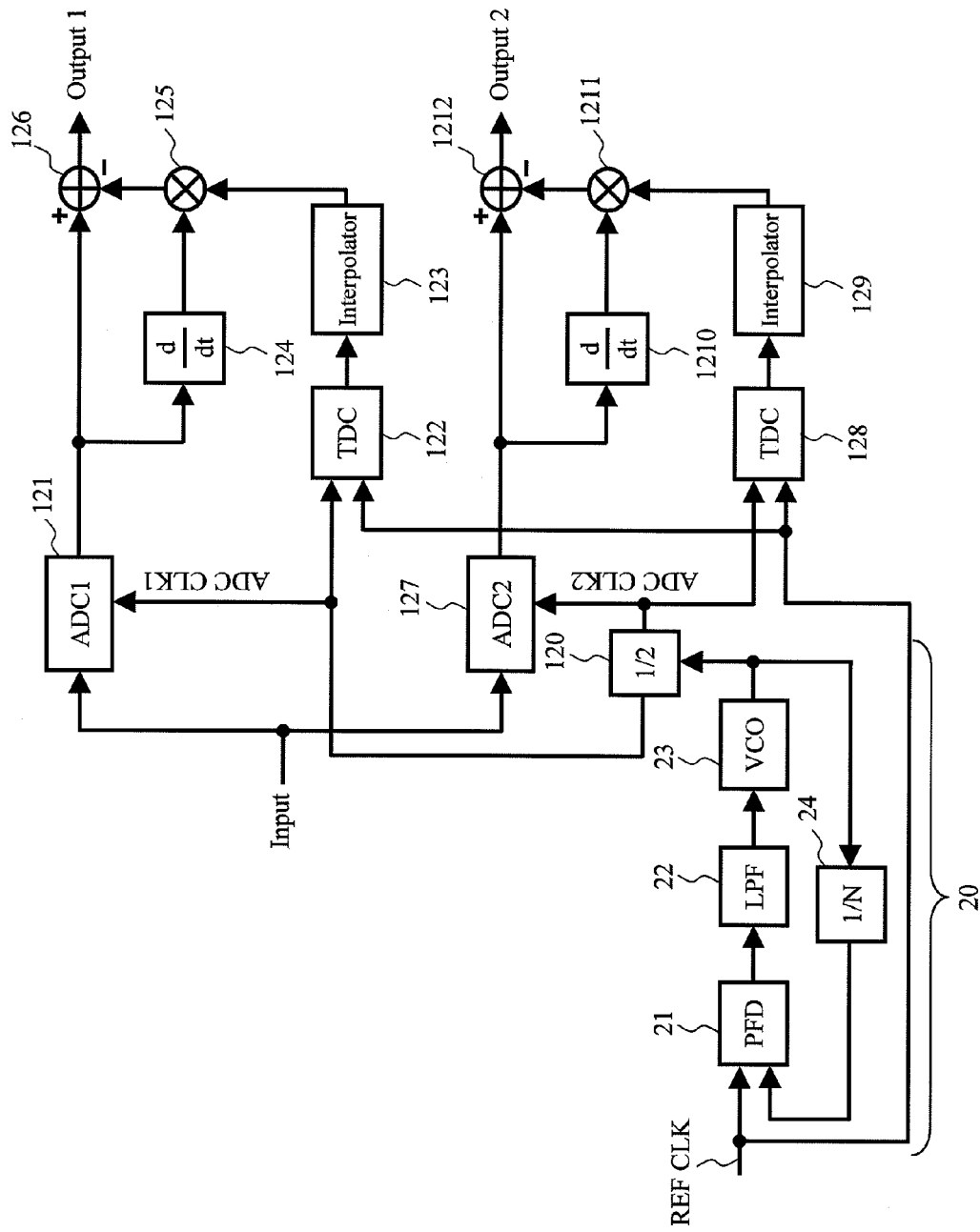
FIG. 12 shows a structure of an analog-to-digital converter having a jitter correcting function according to a fourth embodiment.

FIG. 12 shows an example of a structure of an analog-to-digital converter according to a fourth embodiment. In this embodiment, the time-interleaved type analog-to-digital converter will be explained. As disclosed in Non-patent Documents 3 and 4, the time-interleaved type analog-to-digital converter performs the analog-to-digital conversion for an input signal by a plurality of analog-to-digital conversion units (for example, L units) having the same structure.

The sampling clocks used in the analog-to-digital conversion units have the same frequency. However, the phases of the sampling clocks are different from each other by 360/L degrees. Thus, in practice, the input signal can be converted from analog to digital by a conversion rate that is L times higher than the frequency of the sampling clock (ADC CLK).

For facilitating the explanation, the case where L is 2 will be explained in this embodiment. The explanation described below can be applied to the case where L is a natural number of 3 or more.

The analog-to-digital converter shown in FIG. 12 includes a first analog-to-digital conversion unit 121 (ADC1) and a second analog-to-digital conversion unit 127 (ADC2), to which a common input signal is connected.

A sampling clock (ADC CLK1) of the first analog-to-digital conversion unit 121 and a sampling clock (ADC CLK2) of the second analog-to-digital conversion unit 127 are generated by the phase locked loop (PLL) 20 using the reference clock (REF CLK) as a source oscillation. This point is the same as in the first embodiment. Instead of the PLL 20, the sampling clock (ADC CLK) may be generated by the circuit structure explained in the second and third embodiments.

The phase locked loop (PLL) 20 includes the phase comparator (PFD) 21, the loop filter (LPF) 22, the voltage control oscillator (VCO) 23, the divider (1/N) 24, and the like. The phase comparator 21 may be a phase frequency comparator, and a charge pump circuit may be provided between the phase comparator 21 and the loop filter 22. Generally, a low-pass filter is used as the loop filter 22.

The circuit structure of the phase locked loop 20 is commonly known. Accordingly, the phase locked loop 20 performs the normal operation that is commonly known. Specifically, the output of the voltage control oscillator 23 is synchronized with the phase of the reference clock. The output of the voltage control oscillator 23 includes a sine wave of a frequency that is several times (N times) as large as the number of frequency division of the reference clock in the divider 24, and a clock signal.

In this embodiment, the output of the phase locked loop 20 (i.e., the output of the voltage control oscillator 23) is applied to a 2-divider 120. The 2-divider 120 generates the first sampling clock (ADC CLK1) and the second sampling clock (ADC CLK2) from the applied clock.

The first sampling clock (ADC CLK1) is used as a sampling clock of the first analog-to-digital conversion unit 121, and the second sampling clock (ADC CLK2) is used as a sampling clock of the second analog-to-digital conversion unit 127. The frequency of each of the first sampling clock (ADC CLK1) and the second sampling clock (ADC CLK2) is a half of the frequency of the output of the phase locked loop 20. The phases of the clocks are shifted by 180 degrees (i.e., 360/2 degrees) from each other.

When the frequency division number N is larger than 2, the frequency of the reference clock (REF CLK) is lower than those of the first sampling clock (ADC CLK1) and the second sampling clock (ADC CLK2).

A first digital correction unit is connected to an output side of the first analog-to-digital conversion unit 121 as in the first embodiment. The first digital correction unit digitally corrects a jitter component included in a raw digital output of the first analog-to-digital conversion unit 121. In this embodiment, the operation for subtracting a sampling error voltage caused by the jitter of the sampling clock (ADC CLK1) from the raw digital output is executed.

The first digital correction unit includes a differentiator 124 connected to the output of the first analog-to-digital conversion unit 121, a multiplier 125 that multiplies the output of the differentiator 124 by an estimated value of the jitter, and a subtractor 126 that subtracts the multiplication result from the raw digital output of the first analog-to-digital conversion unit 121.

The first analog-to-digital conversion unit 121 samples an input analog voltage at a voltage transition timing (for example, a rising timing from a low voltage to a high voltage) of the sampling clock (ADC CLK1), and executes the analog-to-digital conversion of the sampled voltage.

For example, when the voltage transition timing of the sampling clock (ADC CLK1) is shifted by $\Delta t1$ from an ideal sampling timing nT (T indicates one conversion cycle and an inverse of a frequency of the sampling clock, and n indicates a sampling number), the sampled voltage is represented by $V(nT+\Delta t1)$. $\Delta t1$ corresponds to a jitter value.

The sampled voltage is represented by the primary approximate expression using $\Delta t1$ as follows.

$$V(nT+\Delta t1)=V(nT)+\Delta t1 * dV/dt(nT)$$

In the raw digital output of the first analog-to-digital conversion unit 121, the sampling voltage error represented by $\Delta t1 * dV/dt(nT)$ is included in the voltage V (nT) sampled at the ideal timing.

Here, $dV/dt(nT)$ is obtained by the differentiator 124. A multiplication value of $\Delta t1$ and $dV/dt(nT)$ is calculated by the multiplier 125. The multiplication value supplies an estimated value of the sampling error voltage, i.e., $\Delta t1 * dV/dt (nT)$. The subtractor 126 subtracts the calculated $\Delta t1 * dV/dt (nT)$ from the raw digital output, and digitally corrects the influence of the sampling error voltage.

Next, how to obtain a jitter value (i.e., $\Delta t$) randomly overlapped with the sampling clock (ADC CLK1) will be explained. Firstly, the sampling clock (ADC CLK1) and the reference clock (REF CLK) are inputted to the time-to-digital converter 122. As described above, the frequency of the reference clock (REF CLK) is one-(frequency division number) th of the frequency of the sampling clock (ADC CLK1).

The time-to-digital converter 122 detects a time difference between each voltage transition timing of the reference clock (REF CLK) and the voltage transition timing of the sampling clock (ADC CLK1) corresponding to the voltage transition timing, and converts it to a digital value.

The sampling clock (ADC CLK1) is applied to the first analog-to-digital conversion unit 121 and the time-to-digital converter 122. Thus, the digital output of the time-to-digital converter 122 is regarded as a timing deviation of voltage transition of the sampling clock (ADC CLK1) at each voltage transition timing of the reference clock (REF CLK), i.e., a digital value of the jitter value.

The interpolator 123 is connected to an output side of the time-to-digital converter 122. The interpolator 123 interpolates a digital value inputted from the time-to-digital converter 122, and obtains estimated values of the jitter at all sampling timing of the sampling clock (ADC CLK1). The jitter estimated value $\Delta t1$ is given to the digital correction unit to be used for digitally correcting the sampling error voltage as described above.

Incidentally, a certain time difference, i.e., skew, may be originally provided between the sampling clock (AD CLK1) inputted to the time-to-digital converter 122 and the reference clock (REF CLK) due to a delay time difference caused by wiring delay. However, even when the skew is present, the skew appears as a direct current component in the output of the time-to-digital converter 122. Thus, to obtain only the jitter value, it is required that the direct current component corresponding to the skew is removed from the output of the time-to-digital converter 122.

Similarly, the second digital correction unit is connected to an output side of the second analog-to-digital conversion unit 127. The second digital correction unit also digitally corrects the jitter component included in the raw digital output of the second analog-to-digital conversion unit 127. In this embodiment, the operation for subtracting a sampling error voltage caused by the jitter of the sampling clock (ADC CLK2) from the raw digital output is executed.

The second digital correction unit includes a differentiator 1210 connected to the output of the second analog-to-digital conversion unit 127, a multiplier 1211 that multiplies the output of the differentiator 1210 by the estimated value of the jitter, and a subtractor 1212 that subtracts the multiplication result from the raw digital output of the second analog-to-digital conversion unit 127.

The second analog-to-digital conversion unit 127 samples an input analog voltage at a voltage transition timing (for example, a rising timing from a low voltage to a high voltage)

of the sampling clock (ADC CLK2), and executes the analog-to-digital conversion for the sampled voltage.

For example, when the voltage transition timing of the sampling clock (ADC CLK2) is shifted by Δt2 from an ideal sampling timing nT+T/2 (T indicates one conversion cycle and an inverse of a frequency of the sampling clock, and n indicates a sampling number), the sampled voltage is represented by V(nT+T/2+Δt2). Δt2 corresponds to the jitter value.

The sampled voltage is represented by the primary approximate expression using Δt2 as follows.

$$V(nT+T/2+\Delta t2)=V(nT+T/2)+\Delta t2*dV/dt(nT+T/2)$$

In the raw digital output of the second analog-to-digital conversion unit 127, the sampling voltage error represented by Δt2*dV/dt(nT+T/2) is included in the voltage V (nT+T/2) sampled at the ideal timing.

Here, dV/dt(nT+T/2) is calculated by the differentiator 1210. A multiplication value of Δt2 and dV/dt(nT+T/2) is calculated by the multiplier 1211. The multiplication value supplies an estimated value of the sampling error voltage, i.e., Δt2*dV/dt(nT+T/2). The subtractor 1212 subtracts the calculated Δt2*dV/dt(nT+T/2) from the raw digital output, and digitally corrects the influence of the sampling error voltage.

Next, how to obtain a jitter value (i.e., Δt) randomly overlapped with the sampling clock (ADC CLK2) will be explained. Firstly, the sampling clock (ADC CLK2) and the reference clock (REF CLK) are inputted to the time-to-digital converter 128. As described above, the frequency of the reference clock (REF CLK) is one-(frequency division number) th of the frequency of the sampling clock (ADC CLK2).

The time-to-digital converter 128 detects a time difference between each voltage transition timing of the reference clock (REF CLK) and the voltage transition timing of the sampling clock (ADC CLK2) corresponding to the voltage transition timing, and converts it to a digital value.

The sampling clock (ADC CLK2) is applied to the second analog-to-digital conversion unit 127 and the time-to-digital converter 128. Thus, the digital output of the time-to-digital converter 128 is regarded as a timing deviation of voltage transition of the sampling clock (ADC CLK2) at each voltage transition timing of the reference clock (REF CLK), i.e., a digital value of the jitter value.

The interpolator 129 is connected to an output side of the time-to-digital converter 128. The interpolator 129 interpolates a digital value inputted from the time-to-digital converter 128, and obtains estimated values of the jitter at all sampling timing of the sampling clock (ADC CLK2). The jitter estimated value Δt2 is given to the digital correction unit to be used for digitally correcting the sampling error voltage as described above.

Incidentally, a certain time difference, i.e., skew, may be originally provided between the sampling clock (AD CLK2) inputted to the time-to-digital converter 128 and the reference clock (REF CLK) due to a delay time difference caused by wiring delay. However, even when the skew is present, the skew appears as a direct current component in the output of the time-to-digital converter 128. Thus, to obtain only the jitter value, it is required that the direct current component corresponding to the skew is removed from the output of the time-to-digital converter 128.

In this embodiment, the differentiator 124 is connected only to the output of the first analog-to-digital conversion unit 121, and the differentiator 1210 is connected only to the output of the second analog-to-digital conversion unit 127. At this time, an accurate differential value to an input frequency of 1/(2T) or less can be outputted.

As disclosed in Non-patent Documents 3 and 4, when the same calculation as shown in FIG. 6 is executed using the outputs of all analog-to-digital conversion units (the first analog-to-digital conversion unit 121 and the second analog-to-digital conversion unit 127 according to this embodiment), an accurate differential value to 1/T that is a Nyquist frequency as the time-interleaved type analog-to-digital converter can be outputted.

Figure 13:
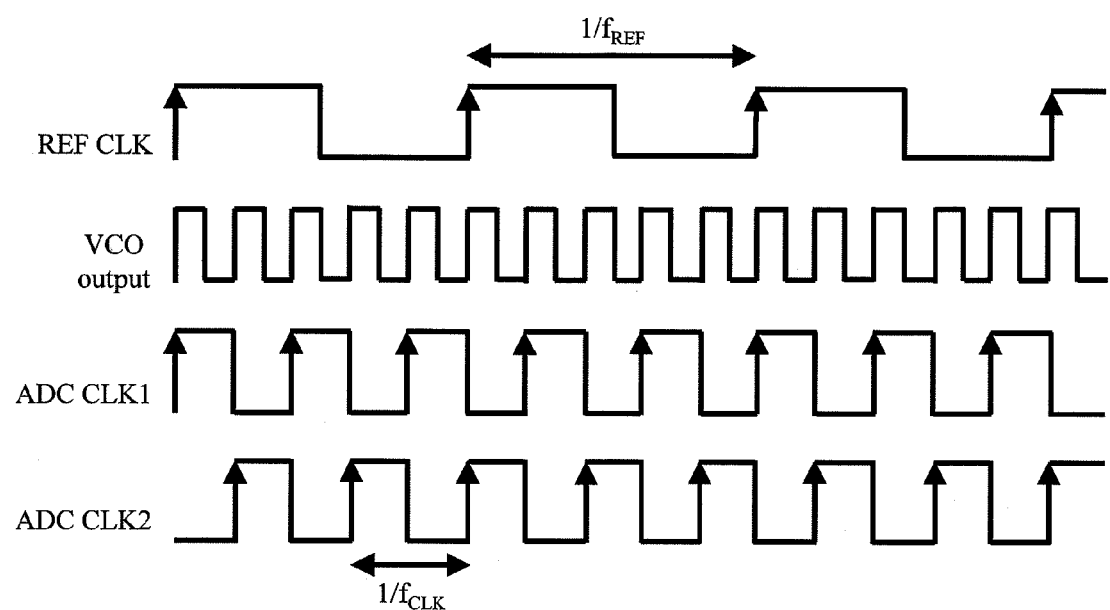
FIG. 13 is an illustration for explaining the operation of the analog-to-digital converter having the jitter correcting function according to the fourth embodiment.

FIG. 13 shows the operation timing of the time-interleaved type analog-to-digital converter according to this embodiment. The output of the voltage control oscillator (VCO) 23 in the phase locked loop is synchronized with the reference clock (REF CLK). The frequency of the voltage control oscillator (VCO) 23 is N times higher than that of the reference clock (REF CLK). N is a frequency division number of the divider 24. In this drawing, N is 5.

As described above, the sampling clock (ADC CLK1) of the first analog-to-digital conversion unit 121 and the sampling clock (ADC CLK2) of the second analog-to-digital conversion unit 127 are generated by dividing the output of the voltage control oscillator (VCO) 23 into two using the divider 120. The phase of the sampling clock (ADC CLK1) is shifted by one-half cycle from the phase of the sampling clock (ADC CLK2).

These waveforms are shown in FIG. 13. As shown in FIG. 13, the first sampling clock (ADC CLK1) and the second sampling clock (ADC CLK2) are synchronized with the reference clock (REF CLK), and are synchronized with the rising timing of the reference clock (REF CLK) once per five times of the rising timings (indicated by up arrows).

Thus, the jitter can be detected using the time-to-digital converters 122 and 128 as described above. Also, the jitter estimated values at four sampling timings between the synchronizing timings can be obtained by interpolation calculation using the interpolators 123 and 129.

As described above, in FIG. 13, the number L of the analog-to-digital conversion units is 2 and the frequency division number N of the divider 24 is 5 to explain the relationship of the operation timings of the reference clock (REF CLK) and the sampling clocks (ADC CLK1 and 2). L and N are decided to be "mutually prime". Since each sampling clock is synchronized with the rising timing of the reference clock once per N times, the same correction operation as in the time-to-digital converters 122 and 128 is possible.

In this embodiment, the reference clock (REF CLK) is a sufficiently low jitter. In practice, the reference clock (REF CLK) that is the sufficiently low jitter can be obtained using an oscillation output from a general quartz oscillator, ceramic oscillator, SAW oscillator, or the like.

(Summary)

As described above, due to the time-interleaved type analog-to-digital converter, the analog-to-digital converter capable of digitally correcting the influence of the jitter at low power consumption can be provided even when the sampling clock as the entire converter becomes ultrafast.

Fifth Embodiment

Figure 14:
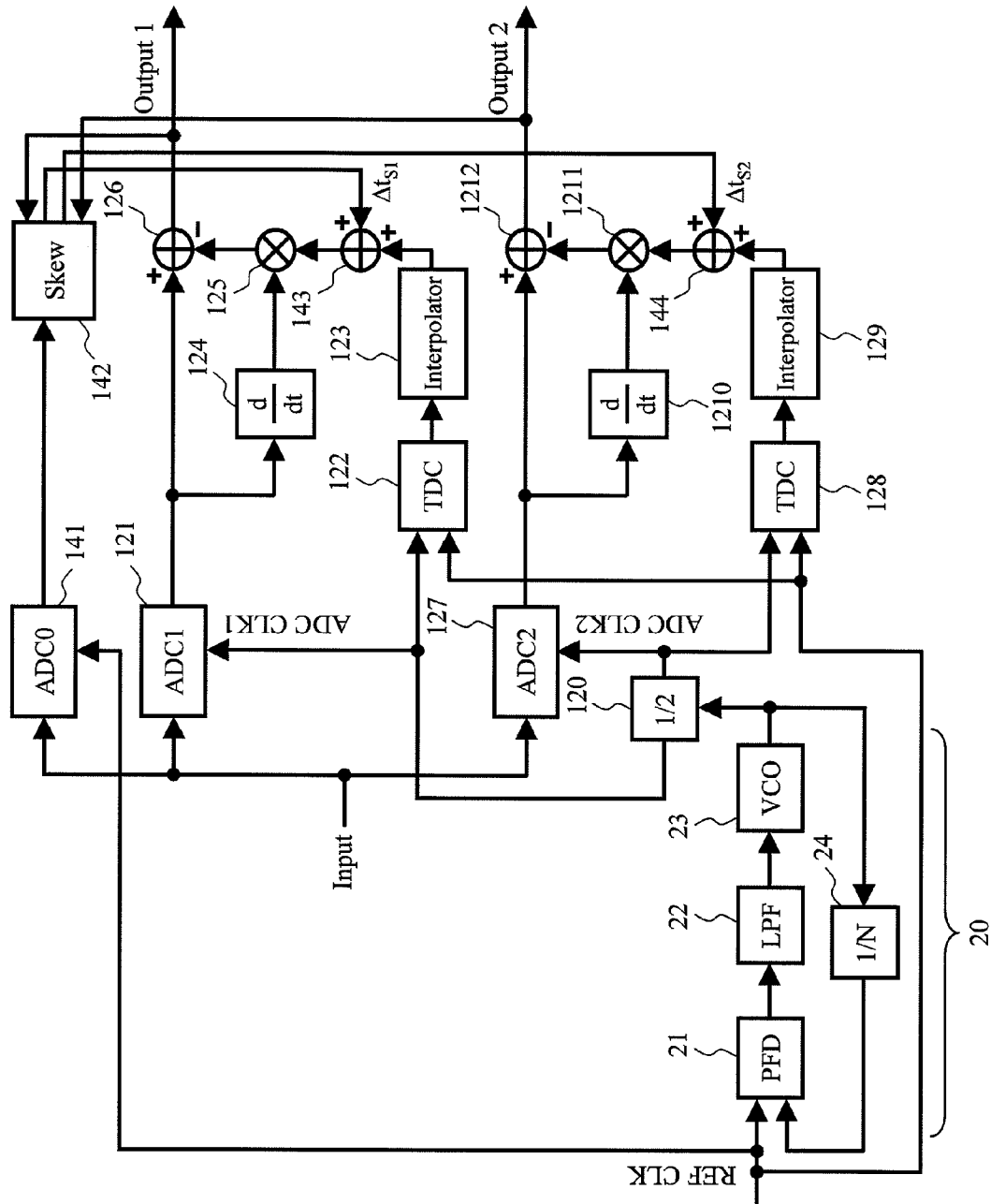
FIG. 14 shows a structure of an analog-to-digital converter having a jitter correcting function according to a fifth embodiment.

FIG. 14 shows an example of a structure of an analog-to-digital converter according to a fifth embodiment. In this embodiment, the time-interleaved type analog-to-digital converter will be explained. However, the analog-to-digital converter according to this embodiment is different from that according to the fourth embodiment in that a mechanism for digitally correcting a skew at a sampling timing in each analog-to-digital conversion unit is provided.

Similarly to the fourth embodiment, the number L of the analog-to-digital conversion units is 2, and the first analog-to-digital conversion unit 121 and the second analog-to-digital conversion unit 127 are provided in this embodiment.

In addition to the circuit structure shown in FIG. 12, the analog-to-digital converter according to the fifth embodiment includes a reference analog-to-digital conversion unit (ADC0) 141, a skew retrieval unit 142, and adders 143 and 144. The adder 143 is used for the first analog-to-digital conversion unit 121, and the adder 144 is used for the second analog-to-digital conversion unit 127.

The circuit structure and operation principle of the portion relating to jitter correction are the same as in the fourth embodiment, and the explanation thereof is omitted in this embodiment.

In this embodiment, the influence of the skew (certain time deviation that is not random) of the sampling clock (ADC CLK1) of the first analog-to-digital conversion unit 121 and the sampling clock (ADC CLK2) of the second analog-to-digital conversion unit 127 is digitally corrected as follows.

An input analog voltage is given to the reference analog-to-digital conversion unit 141 as well as the two analog-to-digital conversion units 121 and 127. In other words, the reference analog-to-digital conversion unit 141 is connected to the input in parallel to the two analog-to-digital conversion units 121 and 127.

The reference analog-to-digital conversion unit 141 samples an input analog voltage by a dedicated sampling clock, and executes the analog-to-digital conversion for the sampled voltage. In this embodiment, the reference clock (REF CLK) that is an oscillation source of the phase locked loop (PLL) 20 is used as the sampling clock for the reference analog-to-digital conversion unit. However, other clocks may be used.

The skew retrieval unit 142 is connected to an output side of the reference analog-to-digital conversion unit 141. The skew retrieval unit 142 inputs the conversion output of the reference analog-to-digital conversion unit 141, the output of the first digital correction unit ("OUTPUT 1" in FIG. 14), the output of the second digital correction unit ("OUTPUT 2" in FIG. 14) and the like, and retrieves the skew of the first sampling clock (ADC CLK1) and the skew of the second sampling clock (ADC CLK2). The skew retrieval unit 142 retrieves the skew with reference to the sampling clock for the reference analog-to-digital conversion unit. In this embodiment, the skew retrieval unit 142 retrieves the skew with reference to the reference clock (REF CLK).

Estimated values $\Delta t_{S1}$ and $\Delta t_{S2}$ of the retrieved skew of the first sampling clock (ADC CLK1) and the second sampling clock (ADC CLK2) are outputted to the adders 143 and 144 from the skew retrieval unit 142. The adder 143 is connected to an output side of the interpolator 123 to output the addition result of the jitter estimated value inputted from the interpolator 123 and the skew estimated value $\Delta t_{S1}$ to the multiplier 125. Similarly, the adder 144 is connected to an output side of the interpolator 129 to output the addition result of the jitter estimated value inputted from the interpolator 129 and the skew estimated value $\Delta t_{S2}$ to the multiplier 1211.

Accordingly, the multipliers 125 and 1211 output to the subtractors 126 and 1212 the result of multiplying the outputs of the adders 143 and 144 by the differential outputs of the corresponding differentiators 124 and 1210. The subtractors 126 and 1212 subtract the outputs of the multipliers 125 and 1211 from the raw digital outputs of the analog-to-digital conversion units 121 and 127. Then, the subtractors 126 and 1212 output a digital value obtained by correcting the influence of the sampling voltage error caused by the jitter and skew.

Incidentally, in FIG. 14, a part of the connection line that is not important is omitted. The accurate structure and operation relating to skew correction are disclosed in Non-patent Documents 3 and 4.

(Summary)

As described above, in this embodiment, the analog-to-digital converter capable of digitally correcting the influence of the skew and jitter at low power consumption even when the sampling clock becomes ultrafast can be provided.

Sixth Embodiment

Figure 15:
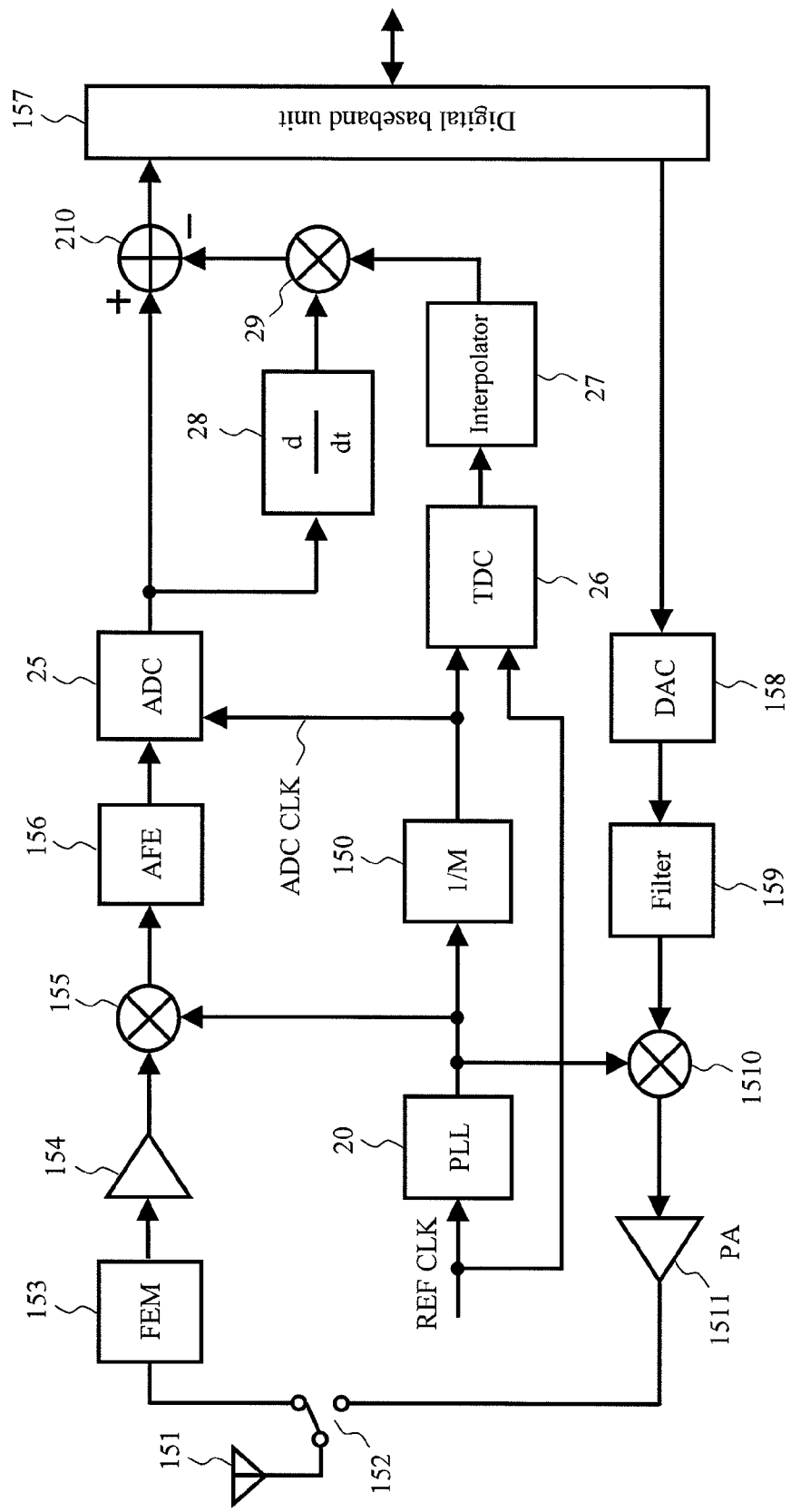
FIG. 15 shows a structure of an analog-to-digital converter having a jitter correcting function according to a sixth embodiment.

FIG. 15 shows a sixth embodiment. In this embodiment, the analog-to-digital converter described in the first embodiment is applied to a general wireless receiver.

The structure of the wireless receiver will be explained. A high frequency wireless signal received by an antenna 151 is inputted to a front end module (FEM) 153 through a transmission/reception changeover switch 152. The front end module 153 is composed of a filter, a balun for single differential conversion, or the like. The output of the front end module 153 is supplied to a radio frequency (RF) circuit to be subjected to signal processing. The RF circuit is composed of, for example, a low noise amplifier (LNA) 154 and the like.

The output of the low noise amplifier 154 is supplied to a reception mixer 155, and the frequency of the output is converted to be lower than the reception frequency. The signal whose the frequency is converted is subjected to signal processing by an analog front end unit (AFE) 156 composed of a preamplifier, a variable gain amplifier, a filter, and the like. The output signal of the analog front end unit 156 is inputted to the analog-to-digital converter composed of the analog-to-digital conversion unit 25 and the like.

The analog-to-digital converter performs the analog-to-digital conversion for the reception signal, and outputs the conversion output to a digital base band unit 157. The digital base band unit 157 executes filtering of a disturbance wave signal and demodulation of reception data, and outputs the reception data to an external interface.

The structure of the wireless transmission circuit will be explained below. The digital base band unit 157 inputs transmission data from the external interface, and generates a transmission base band signal based on the transmission data. The transmission base band signal is converted into an analog signal in a digital-to-analog converter 158. The analog signal is inputted to a filter 159, and the band is restricted to protect a transmit spectrum mask.

The output signal of the filter 159 is inputted to a transmission mixer 1510, and frequency-converted to be a high frequency signal. The electric power of the signal after the frequency conversion is amplified to a desired transmission electric power in a power amplifier (PA) 1511. Then, the signal after the power amplification is supplied to an antenna 151 through a transmission/reception changeover switch 152 to be transmitted.

A reception mixer 155 and a transmission mixer 1510 multiply their input signals by a local oscillation signal supplied from the phase locked loop 20 to execute a desired frequency conversion. The local oscillation signal is generated by the phase locked loop 20 using the reference clock (REF CLK) as a source oscillation.

In this embodiment, the sampling clock (ADC CLK) of the analog-to-digital conversion unit 25 is generated using the output of the phase locked loop 20 used for frequency conversion. The divider 150 is connected to an output side of the phase clocked loop 20 and the local oscillation signal of the phase locked loop 20 is divided into M (M is an integer) to generate the sampling clock (ADC CLK).

The structures and operations of the analog-to-digital conversion unit 25, the digital correction unit, the time-to-digital converter 26, and the interpolator 27 for constituting the analog-to-digital converter are the same as those in the first embodiment. In other words, the analog-to-digital converter digitally corrects the influence of the jitter of the sampling clock (ADC CLK) based on the jitter value detected by the time-to-digital converter 26 and the jitter estimated value.

Since the frequency of the sampling clock (ADC CLK) is strictly synchronized with the frequency of the reference clock (REF CLK), the rising timings of them are regularly synchronized with each other. Thus, the same correction operation as in the first embodiment can be executed.

(Summary)

In this embodiment, the analog-to-digital converter that operates with the ultrafast sampling clock is mounted in the wireless receiver as described above. Furthermore, the analog-to-digital converter used in this embodiment operates at the low power consumption. Thus, it is particularly effective for a portable wireless receiver.

Seventh Embodiment

Figure 16:
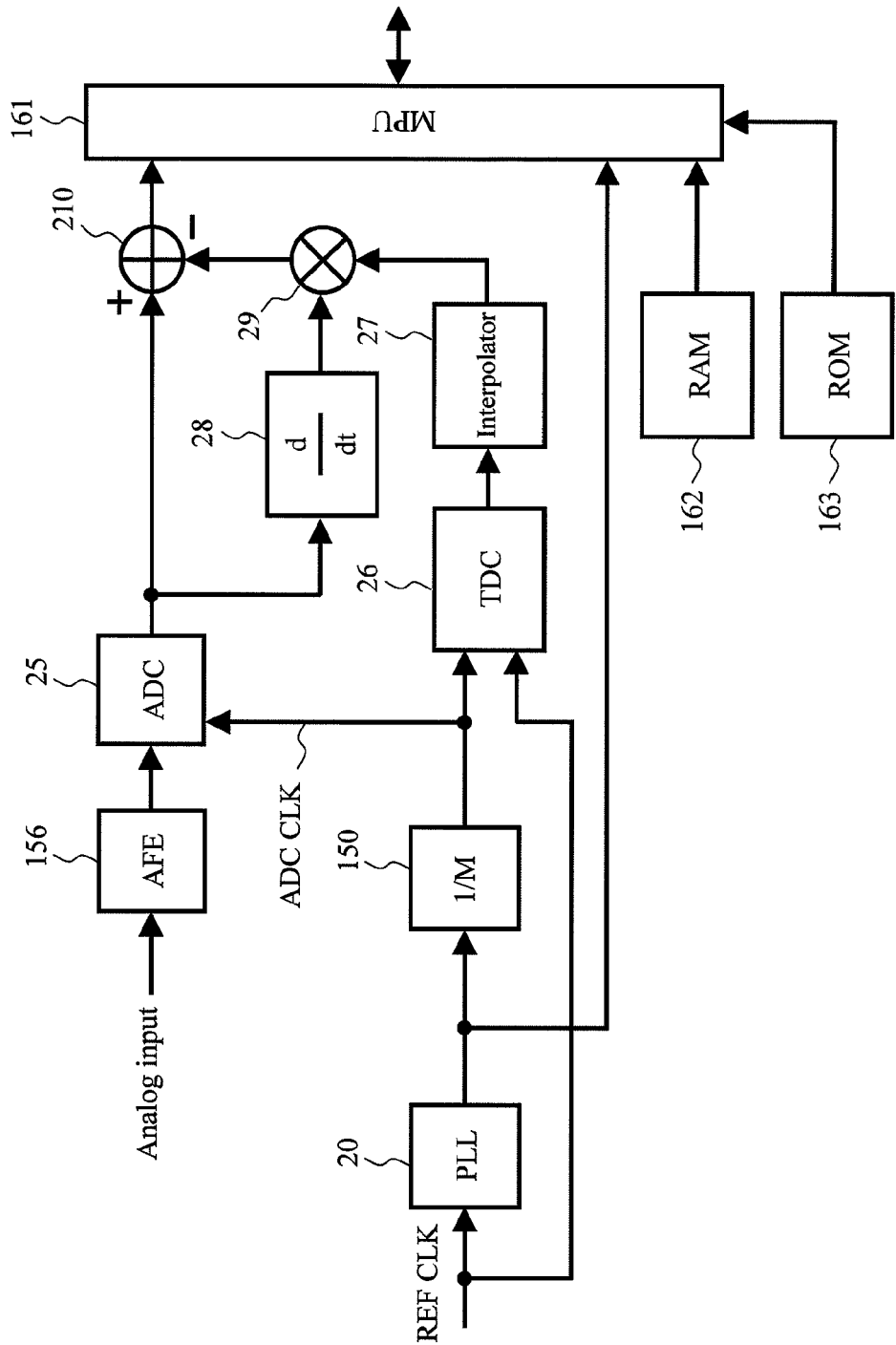
FIG. 16 shows a structure of an analog-to-digital converter having a jitter correcting function according to a seventh embodiment.

FIG. 16 shows a seventh embodiment. In this embodiment, the analog-to-digital converter explained in the first embodiment is applied to a microcomputer chip.

The microcomputer chip includes a micro processing unit (MPU) 161, a random access memory (RAM) 162, a read only memory (ROM) 163, an analog-to-digital converter, a phase locked loop 20, and the like.

An analog signal inputted from an analog input terminal is subjected to predetermined analog signal processing in an analog front end unit 156. Then, the analog signal is inputted to the analog-to-digital converter composed of the analog-to-digital conversion unit 25 and the like. The analog-to-digital converter executes the analog-to-digital conversion for the analog signal and outputs the conversion output to the micro processing unit 161. The micro processing unit 161 executes predetermined processing for the analog signal to be processed.

Clock signals necessary for the operations of the micro processing unit 161, the RAM 162, and the ROM 163 are generated in the phase locked loop 20 and are supplied. The sampling clock (ADC CLK) of the analog-to-digital conversion unit 25 is generated using the output of the phase locked loop 20. Specifically, a local oscillation signal of the phase locked loop 20 is supplied to the divider 150 to be divided into M (M is an integer) to generate a sampling clock (ADC CLK).

The structures and operations of the analog-to-digital conversion unit 25, the digital correction unit, the time-to-digital converter 26, and the interpolator 27 are the same as those in the first embodiment. In other words, the analog-to-digital converter digitally corrects the influence of jitter of the sampling clock (ADC CLK) based on the jitter value detected by the time-to-digital converter 26 and the jitter estimated value.

Since the frequency of the sampling clock (ADC CLK) is strictly synchronized with the frequency of the reference clock (REF CLK), the rising timings of them are regularly synchronized with each other. Thus, the same correction operation as in the first embodiment can be executed.

(Summary)

In this embodiment, the analog-to-digital converter that operates with the ultrafast sampling clock is mounted in the microcomputer chip as described above. Furthermore, the analog-to-digital converter used in this embodiment operates at the low power consumption. Thus, it is particularly effective to a microcomputer chip mounted in a portable device.

Specific Example of Time-to-Digital Converter

Figure 17:
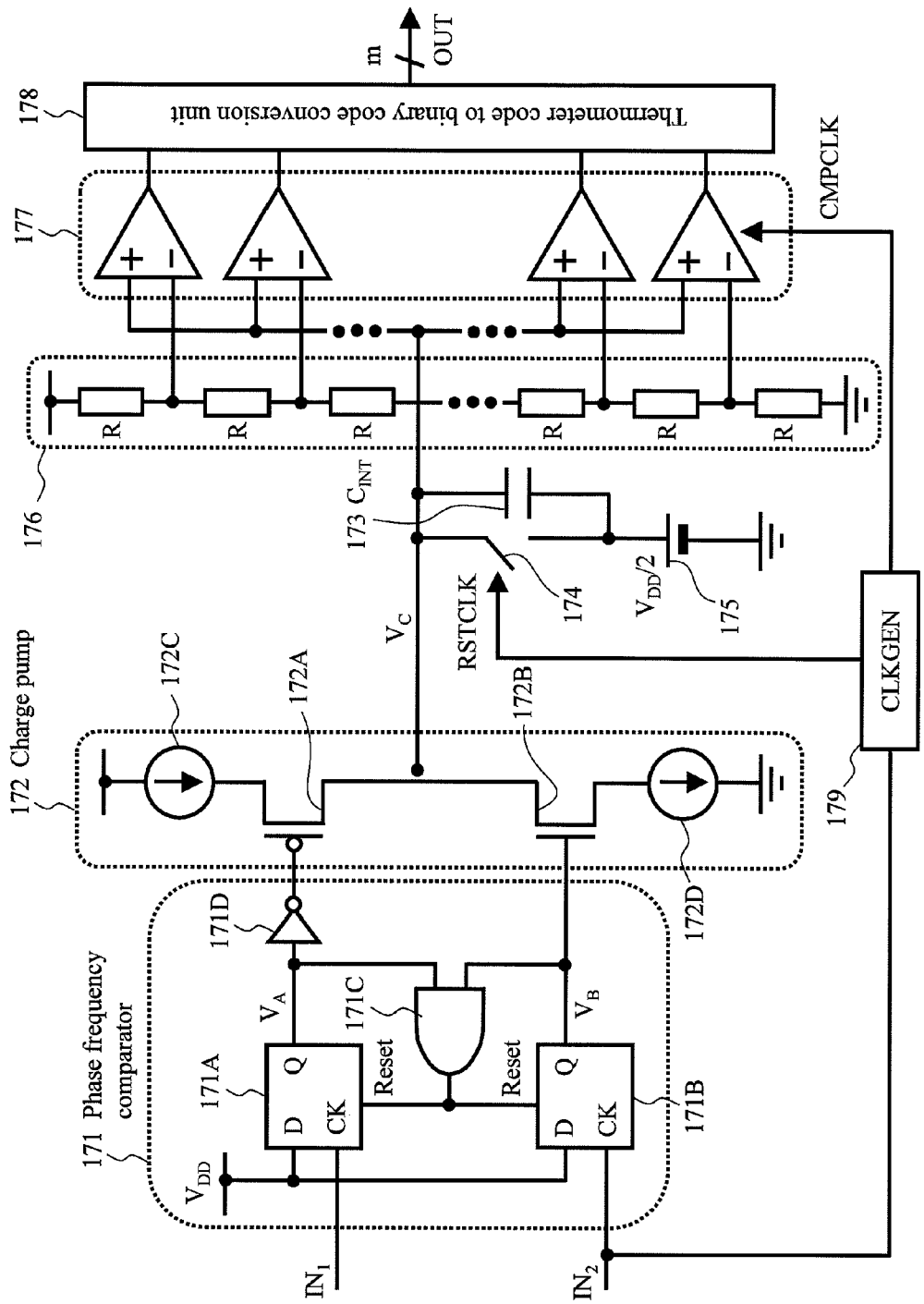
FIG. 17 shows an example of a structure of a time-to-digital converter (TDC).

FIG. 17 shows exemplary circuit implementation of the time-to-digital converter (TDC) used in the embodiments. Specifically, FIG. 17 shows the preferred circuit implementation using the time-to-digital converter 26 (FIGS. 2, 8, 10, 15, and 16) and the time-to-digital converters 122 and 128 (FIGS. 12 and 14).

ADC CLK is inputted from "IN$_1$" and REF CLK is inputted from "IN$_2$". These two clock inputs are inputted to a phase frequency comparator 171. The phase frequency comparator 171 controls a charge pump 172 in accordance with the rising timings of the two clocks. In accordance with the control, a current is charged and discharged to a capacitative element C$_{INT}$173 from the output of the charge pump 172. Consequently, a voltage is generated in the output of the charge pump 172 in accordance with a time difference between the rising timings of ADC CLK and REF CLK. This voltage is A/D converted into a digital value by a conventional flush analog-to-digital converter (ADC) composed of a resistor ladder 176, a comparator array 177, and a thermometer code to binary code conversion unit 178. As described above, the digital value in accordance with the time difference between the rising timings of the two input CLKs is outputted to "OUT".

The structures and operation of parts constituting the time-to-digital converter will be explained below in detail. The phase frequency comparator 171 has the same structure as a phase frequency comparator often used in a conventional PLL. Specifically, in two D flip flops 171A and 171B, clock input terminals "CK" are connected to IN$_1$ (ADC CLK) and IN$_2$ (REF CLK), respectively, and data input terminals "D" are connected to a power-supply voltage V$_{DD}$. The outputs of these two D flip flops are connected to an input of a delay AND gate 171C. The output of the delay AND gate 171C is connected to reset terminals "Reset" of the two D flip flops 171A and 171B.

Figure 18:
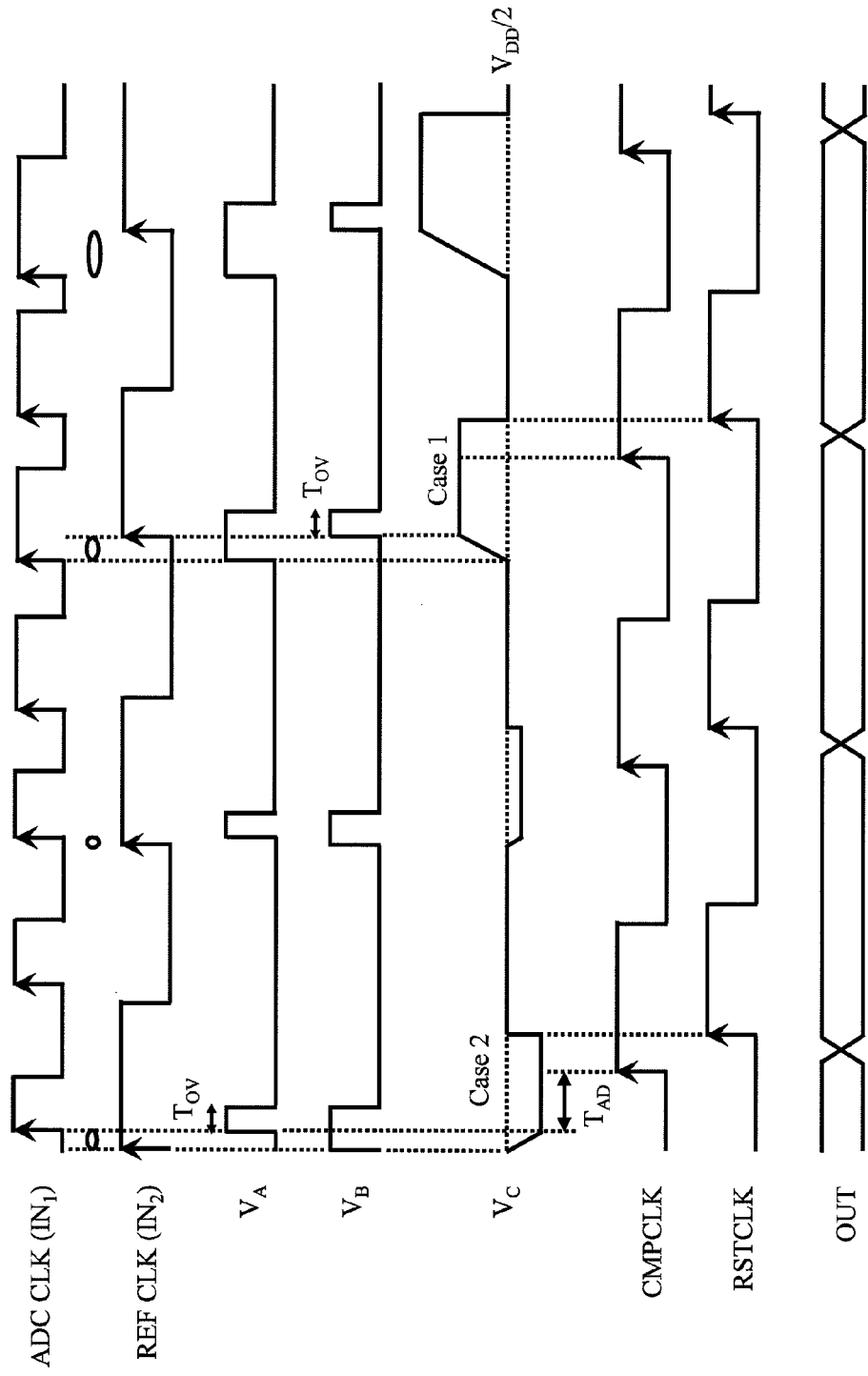
FIG. 18 shows an example of an operational waveform of the time-to-digital converter (TDC).

FIG. 18 shows operational waveforms of the parts constituting TDC. As shown in FIG. 18, the output of the D flip flop 171A ("V$_A$" in FIG. 17) is synchronized with the rising timing of ADC CLK, so that the output is changed from a low level to a high level. On the other hand, the output of the D flip flop 171B ("V$_B$" in FIG. 17) is synchronized with the rising timing of REF CLK, so that the output is changed from a low level to a high level.

When the outputs of the two D flip flops 171A and 171B are at the high level, the output of the delay AND gate 171C is changed from a low level to a high level after a delay time of T$_{OV}$ that is purposely set. Consequently, the outputs of the two D flip flops 171A and 171B are reset at the low level. As shown in FIG. 18, the outputs V$_A$ and V$_B$ becomes the low level after the time of T$_{OV}$ is elapsed from either one of the rising timings of ADC CLK and REF CLK that is later. T$_{OV}$ is purposely provided as described above to correctly detect CLK even when the time difference between the rising timings of ADC CLK and REF CLK is extremely small. This technique is commonly known as a technique for avoiding a "dead zone" of the phase frequency comparator 171 of PLL.

Firstly, the case where the rising timing of ADC CLK is earlier than the rising timing of REF CLK ("CASE 1" in FIG. 18) will be explained. When the output V$_A$ of the D flip flop 171A becomes a high level at the rising timing of ADC CLK, an output of an inverting gate 171D becomes a low level. At this time, a PMOS switch 172A in the charge pump 172 is turned on. Consequently, a current is charged to a capacitative element $C_{INT}$173 from a PMOS current supply 172C through a PMOS switch 172A. During charging of the current, an output voltage $V_C$ of the charge pump 172 is linearly increased.

Then, when the output $V_B$ of the D flip flop 171B becomes a high level at the rising timing of REF CLK, an NMOS switch 172B is also turned on. At this time, a current is sucked from the capacitative element $C_{INT}$173 to the NMOS current supply 172D through the NMOS switch 172B. The supply current value supplied by the PMOS current supply 172C and the sink current value supplied by the NMOS current supply 172D are set to be the same. Accordingly, the supply current and the sink current are balanced out, so that the current is not delivered to the capacitative element $C_{INT}$173. Consequently, the output voltage $V_C$ of the charge pump 172 is maintained constant after the rising timing of REF CLK. In other words, the current is charged only during the period corresponding to the time difference between the rising timings of ADC CLK and REF CLK, and a voltage value after charging is maintained.

Next, the case where the rising timing of REF CLK is earlier than the rising timing of ADC CLK ("CASE 2" in FIG. 18) will be explained. At this time, the output $V_B$ of the D flip flop 171B is turned on before the output $V_A$ of the D flip flop 171A. Thus, a current is discharged from the capacitative element $C_{INT}$173 only during the period corresponding to the time difference between the rising timings of REF CLK and ADC CLK, and a voltage value after discharging is maintained.

Thus, the output voltage $V_C$ of the charge pump 172 is represented by the following formula.

$$V_C = \frac{I_{CP}}{C_{INT}} \cdot \Delta t + \frac{V_{DD}}{2} \qquad \text{Formula (1)}$$

In this formula, $I_{CP}$ indicates a current value of the PMOS current supply 172C and the NMOS current supply 172D, and $\Delta t$ indicates a time difference between the rising timings of ADC CLK and REF CLK (a positive number is used when the rising timing of ADC CLK is earlier). As shown in FIG. 17, a direct current bias is given to the output voltage $V_C$ by connecting a lower electrode of the capacitative element $C_{INT}$173 to the voltage supply 175. In this example, $V_{DD}/2$ that is convenient for operation of a flush ADC unit positioned on a lower stage is supplied as the direct current bias. Thus, the voltage value of the voltage supply 175 is set to be $V_{DD}/2$.

In the flush ADC unit, the output voltage $V_C$ of the charge pump 172 is A/D converted at m bits. Comparators (indicated by triangles) constituting the comparator array 177 of the flush ADC unit compares the output voltage $V_C$ with each voltage for comparison supplied from the resistor ladder 176 by using the rising timing of CMPCLK generated from RE CLK as a trigger. Each comparator outputs either one of a high level or a low level in accordance with the comparison result.

The thermometer code to binary code conversion unit 178 converts the output of each comparator into a binary code and outputs it as "OUT". An electric charge maintained by the capacitative element $C_{INT}$173 may be leaked through the PMOS switch 172A and the NMOS switch 172B in the charge pump 172 and the reset switch 174 connected to the capacitative element $C_{INT}$173 in parallel. Thus, the leak period (the period from determination of the output voltage VC until each comparator starts determination ($T_{AD}$ in FIG. 18)) needs to be the minimum.

After the A/D conversion in the flush ADC unit is completed (in other words, "OUT" in FIG. 18 is determined), RSTCLK is risen to a high level to turn on the reset switch 174. Accordingly, the electric charge of the capacitative element $C_{INT}$173 is reset to zero. In other words, the capacitative element $C_{INT}$173 is in a state to be prepared for next comparison between the rising timing of ADC CLK and the rising timing of REF CLK. RSTCLK can be generated from REF CLK in the clock generation unit 179 as well as CMPCLK.

As represented by the formula (I), the conversion gain of TDC shown in FIG. 17 is given at $I_{CP}/C_{INT}$. By increasing the conversion gain, the noise voltage generated in the flush ADC unit is sufficiently reduced as an input conversion jitter of TDC. The input conversion jitter of the two D flip flops 171A and 171B serves as the input conversion jitter of TDC. Thus, the input conversion jitter of the two D flip flops 171A and 171B need to be sufficiently reduced. The reduction of the input conversion jitter of TDC is a performance that is most required as TDC to be adopted in the embodiments.

For example, when the jitter of ±8 ps at the maximum is converted by TDC of 4 bits, 1 LSB is represented by 8 ps×2/$2^4$=1 ps. By executing the correction according to the embodiments using TDC, a residual jitter after the correction can be reduced to ±½ LSB or less (i.e., ±0.5 ps or less). As described above, the time difference between the rising timings of ADC CLK and REF CLK is converted into a voltage by the conversion gain $I_{CP}/C_{INT}$. For example, when $I_{CP}$=2 mA and $C_{ENT}$=50 fF, the time difference of 1 ps is converted to the voltage of 40 mV. Thus, the flush ADC unit is provided so that 1 LSB is 40 mV and the full scale voltage is 40 mV×$2^4$=640 mV.

Incidentally, the input conversion direct current offset of TDC, which may be generated by response delay of the inverting gate 171D, and the PMOS switch 172A and NMOS switch 172B in the charge pump 172, can be easily detected and eliminated. Thus, the input conversion direct current offset is not a problem.

DESCRIPTION OF SYMBOLS

10: analog-to-digital converter
11: phase locked loop
12: divider
13: analog-to-digital conversion unit
14: time-to-digital converter
15: digital correction unit
20: phase locked loop
21: phase comparator
22: loop filter
23: voltage control oscillator
24: divider
25: analog-to-digital conversion unit
26: TDC (time-to-digital converter)
27: interpolator
28: differentiator
29: multiplier
210: subtractor
61 to 65: delay device
66 to 611: constant multiplier
612: adder
71: delay device
72: adder
81: duty adjustment unit
82: band pass filter 83: buffer
101: injection locking oscillator
120: 2-divider
121, 127: analog-to-digital conversion unit
122, 128: TDC
123, 129: interpolator
124, 1210: differentiator
125, 1211: multiplier
126, 1212: subtractor
141: reference analog-to-digital conversion unit
142: skew retrieval unit
143, 144: adder
150: divider
151: antenna
152: switch
153: front end module
154: low noise amplifier
155: reception mixer
156: analog front end unit
157: digital base band unit
158: digital-to-analog converter
159: filter
1510: transmission mixer
1511: power amplifier
161: MPU (micro processing unit)
162: RAM (random access memory)
163: ROM (read only memory)
171: phase frequency comparator
171A, 171B: D flip flop
171C: delay AND gate
171D: inverting gate
172: charge pump
172A: PMOS switch
172B: NMOS switch
172C: PMOS current supply
172D: NMOS current supply
173: capacitative element
174: reset switch
175: voltage supply
176: resistor ladder
177: comparator array
178: thermometer code to binary code conversion unit
179: clock generation unit

What is claimed is:

1. An analog-to-digital converter for sampling an input analog voltage and converting the input analog voltage into a digital value, comprising:
a phase locked loop that uses a reference clock as a source oscillation, has a higher frequency than the reference clock, and generates a sampling clock synchronizing with the reference clock;
an analog-to-digital conversion unit that samples the input analog voltage using the sampling clock and converts the input analog voltage into a digital value;
a time-to-digital converter that detects a time difference between a voltage transition timing of the reference clock and a voltage transition timing of the sampling clock and converts the time difference into a differential digital value; and
a digital correction unit that interpolates the differential digital value to obtain an interpolation value corresponding to each sampling timing and digitally corrects influence of jitter of the sampling clock included in a raw digital output of the analog-to-digital conversion unit by the interpolation value.

2. The analog-to-digital converter according to claim 1, wherein
the digital correction unit obtains a differential value of the raw digital output of the analog-to-digital conversion unit and digitally corrects the raw digital output based on the differential value and the interpolation value.

3. An analog-to-digital converter for sampling an input analog voltage and converting the input analog voltage into a digital value, comprising:
a plurality of analog-to-digital conversion units that sample the input analog voltage using a plurality of corresponding first sampling clocks having the same frequency and different phases from each other;
a plurality of time-to-digital converters provided corresponding to the analog-to-digital conversion units for detecting a time difference between a voltage transition timing of a reference clock and a voltage transition timing of the first sampling clock and converting the time difference into a differential digital value; and
a plurality of digital correction units provided corresponding to the analog-to-digital conversion units for interpolating the differential digital value to obtain an interpolation value corresponding to each sampling timing and digitally correcting influence of jitter of the first sampling clock included in a raw digital output of the corresponding analog-to-digital conversion unit by the interpolation value.

4. The analog-to-digital converter according to claim 3, further comprising:
a reference analog-to-digital converter; and
a skew retrieval unit, wherein
the reference analog-to-digital converter samples the input analog voltage by a plurality of first sampling clocks corresponding to the analog-to-digital conversion units and a second sampling clock having a frequency sequentially synchronizing with the sampling timings, and generates a reference digital value,
the skew retrieval unit retrieves a sampling timing skew included in each of the plurality of first sampling clocks, and supplies the obtained sampling timing skew to the digital correction units, and
the plurality of digital correction units digitally correct influence of jitter and skew of the first sampling clocks included in the raw digital output of the corresponding analog-to-digital conversion unit based on the corresponding interpolation value and the sampling timing skew.

5. The analog-to-digital converter according to claim 3, wherein
the plurality of first sampling clocks are generated by dividing a third sampling clock synchronizing with a reference clock generated by a phase locked loop using the reference clock, whose frequency is lower than that of the first sampling clocks, as a source oscillation.

6. The analog-to-digital converter according to claim 4, wherein
the plurality of first sampling clocks are generated by dividing a fourth sampling clock synchronizing with a reference clock generated by a phase locked loop using the reference clock, whose frequency is lower than that of the first sampling clocks, as a source oscillation.

7. The analog-to-digital converter according to claim 3, wherein
each of the plurality of digital correction units obtains a differential value of the raw digital output of the corresponding analog-to-digital conversion unit and digitally corrects the raw digital output based on the differential value and the corresponding interpolation value.

8. The analog-to-digital converter according to claim 4, wherein
each of the plurality of digital correction units obtains a differential value of the raw digital output of the corresponding analog-to-digital conversion unit and digitally corrects the raw digital output based on the differential value and the corresponding interpolation value.

9. The analog-to-digital converter according to claim 5, wherein
each of the plurality of digital correction units obtains a differential value of the raw digital output of the corresponding analog-to-digital conversion unit and digitally corrects the raw digital output based on the differential value and the corresponding interpolation value.

10. The analog-to-digital converter according to claim 6, wherein
each of the plurality of digital correction units obtains a differential value of the raw digital output of the corresponding analog-to-digital conversion unit and digitally corrects the raw digital output based on the differential value and the corresponding interpolation value.

11. The analog-to-digital converter according to claim 3, wherein
the first sampling clocks corresponding to the plurality of analog-to-digital conversion units are generated by extracting a harmonic wave included in the reference clock or a division output thereof by filtering, and dividing the extracted harmonic wave.

12. The analog-to-digital converter according to claim 4, wherein
the first sampling clocks corresponding to the plurality of analog-to-digital conversion units are generated by extracting a harmonic wave included in the reference clock or a division output thereof by filtering, and dividing the extracted harmonic wave.

13. The analog-to-digital converter according to claim 3, wherein
the plurality of first sampling clocks corresponding to the plurality of analog-to-digital conversion units are generated by injecting the reference clock or a division output thereof into an injection locking oscillator, dividing an oscillation output of the injection locking oscillator, and using an obtained division output.

14. The analog-to-digital converter according to claim 4, wherein
the plurality of first sampling clocks corresponding to the plurality of analog-to-digital conversion units are generated by injecting the reference clock or a division output thereof into an injection locking oscillator, dividing an oscillation output of the injection locking oscillator, and using an obtained division output.

15. A wireless receiver, comprising:
a reception circuit unit for receiving a wireless signal, the reception circuit having an analog-to-digital converter including a phase locked loop that uses a reference clock as a source oscillation, has a higher frequency than the reference clock and generates a sampling clock synchronizing with the reference clock,
an analog-to-digital conversion unit that samples an input analog voltage using the sampling clock and converts the input analog voltage into a digital value,
a time-to-digital converter that detects a time difference between a voltage transition timing of the reference clock and a voltage transition timing of the sampling clock and converts the time difference into a differential digital value,
and a digital correction unit that interpolates the differential digital value to obtain an interpolation value corresponding to each sampling timing and digitally corrects influence of jitter of the sampling clock included in a raw digital output of the analog-to-digital conversion unit by the interpolation value; and
a phase locked loop that generates a local oscillation signal for converting a frequency of the wireless signal.

* * * * *